(12) United States Patent
Hamamoto

(10) Patent No.: US 7,719,056 B2
(45) Date of Patent: May 18, 2010

(54) SEMICONDUCTOR MEMORY DEVICE HAVING A FLOATING BODY AND A PLATE ELECTRODE

(75) Inventor: Takeshi Hamamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 11/687,131

(22) Filed: Mar. 16, 2007

(65) Prior Publication Data
US 2008/0032474 A1    Feb. 7, 2008

(30) Foreign Application Priority Data
Jul. 11, 2006    (JP) ............... 2006-190585

(51) Int. Cl.
*H01L 27/088* (2006.01)
(52) U.S. Cl. ............... 257/347; 257/392; 257/E27.084
(58) Field of Classification Search ............... 257/347, 257/392, E27.084
See application file for complete search history.

(56) References Cited

U.S. PATENT DOCUMENTS

| | | | |
|---|---|---|---|
| 5,943,581 A * | 8/1999 | Lu et al. | 438/386 |
| 6,919,238 B2 * | 7/2005 | Bohr | 438/166 |
| 6,965,147 B2 * | 11/2005 | Shino | 257/347 |
| 2002/0043692 A1 * | 4/2002 | Maeda et al. | 257/392 |

FOREIGN PATENT DOCUMENTS

| JP | 2001-144276 | 5/2001 |
|---|---|---|
| JP | 2002-246571 | 8/2002 |

OTHER PUBLICATIONS

Tsutomu Sato, et al., "Trench Transformation Technology using Hydrogen Annealing for Realizing Highly Reliable Device Structure with Thin Dielectric Films", VLSI Tech. Dig., 1998, 2 pages.
Tsutomu Sato, et al., "A new Substrate Engineering for the Formation of Empty Space in Silicon (ESS) induced by Silicon Surface Migration", IEDM Tech. Dig., 1999, 4 pages.

* cited by examiner

*Primary Examiner*—Jerome Jackson, Jr.
*Assistant Examiner*—David Z Chen
(74) *Attorney, Agent, or Firm*—Oblon, Spivak, McClelland, Maier & Neustadt, L.L.P.

(57) ABSTRACT

This disclosure concerns a method of manufacturing a semiconductor memory device comprising forming a plurality of trenches in a semiconductor substrate; forming a semiconductor layer provided on a cavity by connecting lower spaces of the trenches to one another and closing upper openings of the trenches in a heat treatment under a hydrogen atmosphere; etching the semiconductor layer in an isolation formation area; forming an insulating film on a side surface and a bottom surface of the semiconductor layer; filling the cavity under the semiconductor layer with an electrode material; and forming a memory element on the semiconductor layer.

7 Claims, 29 Drawing Sheets

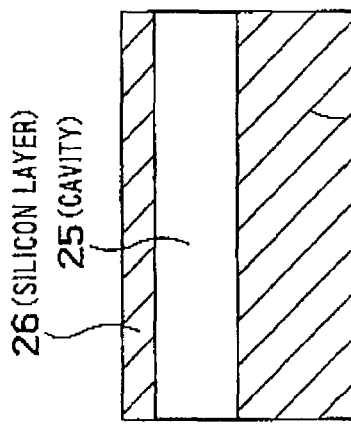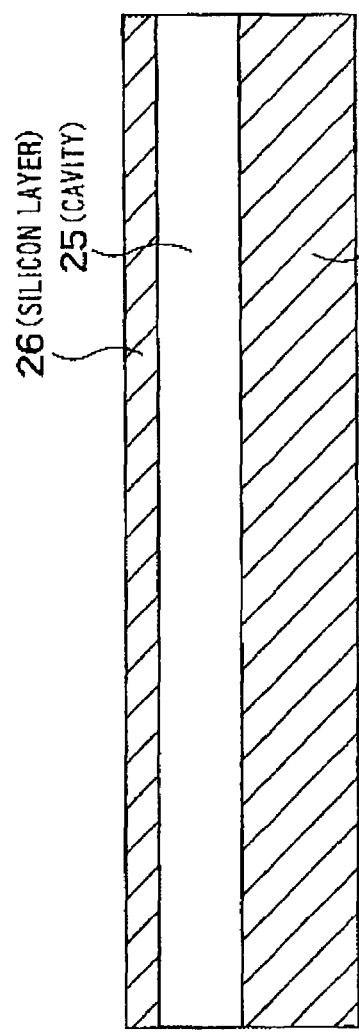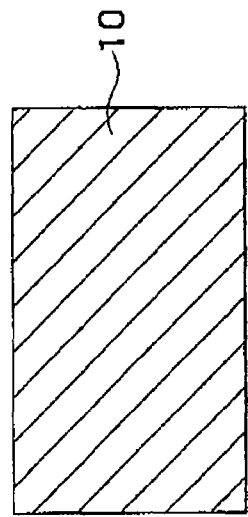

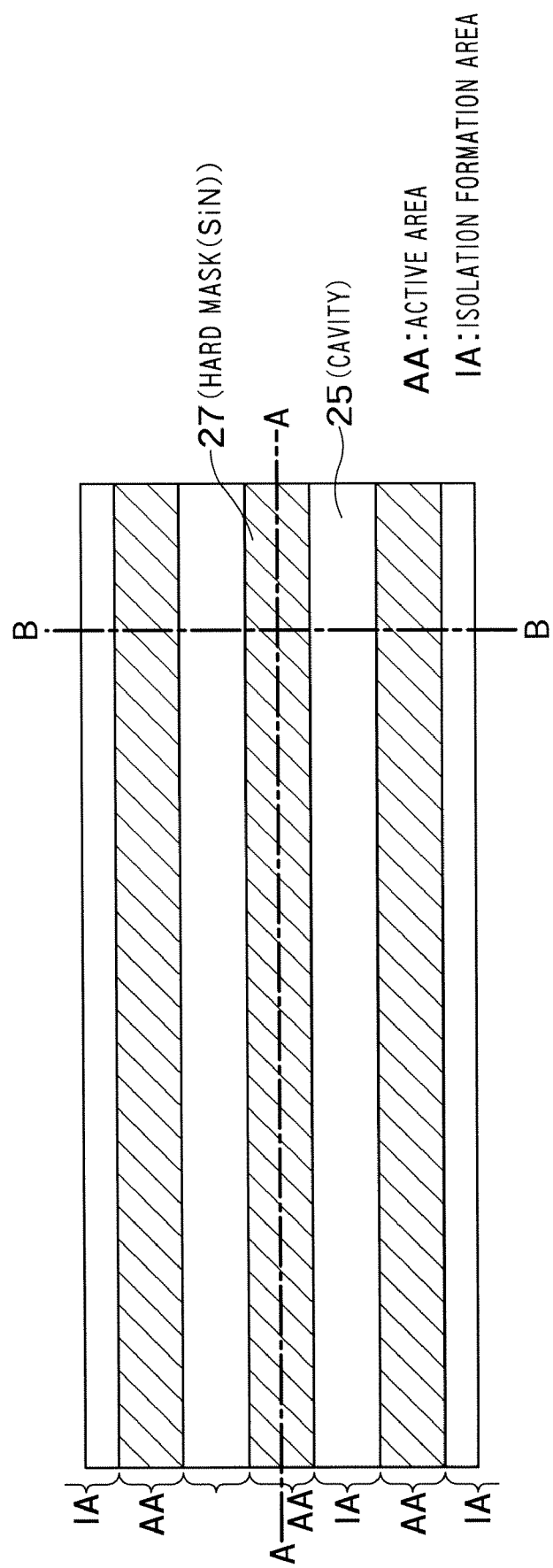

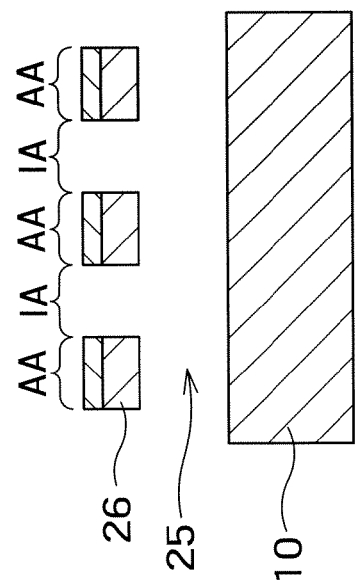
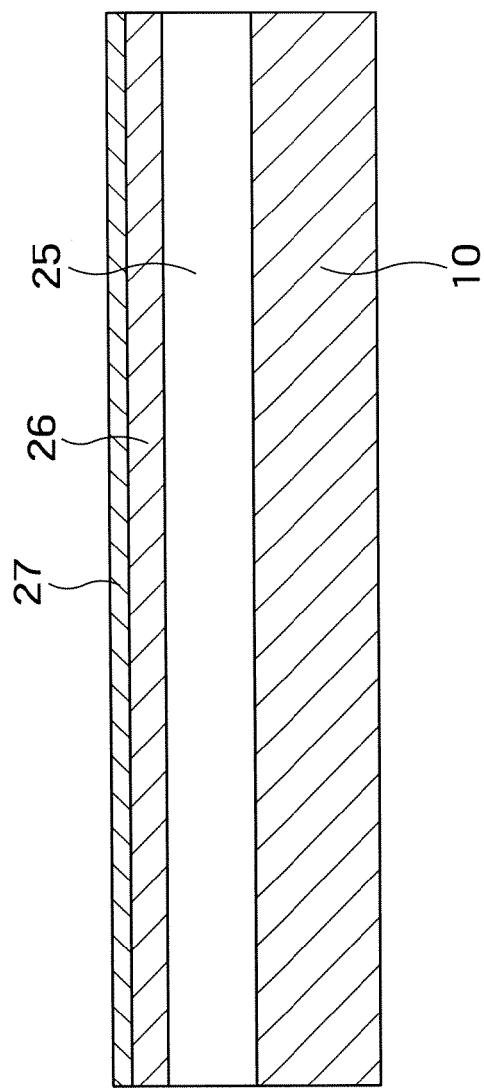
FIG. 6B
FIG. 6A

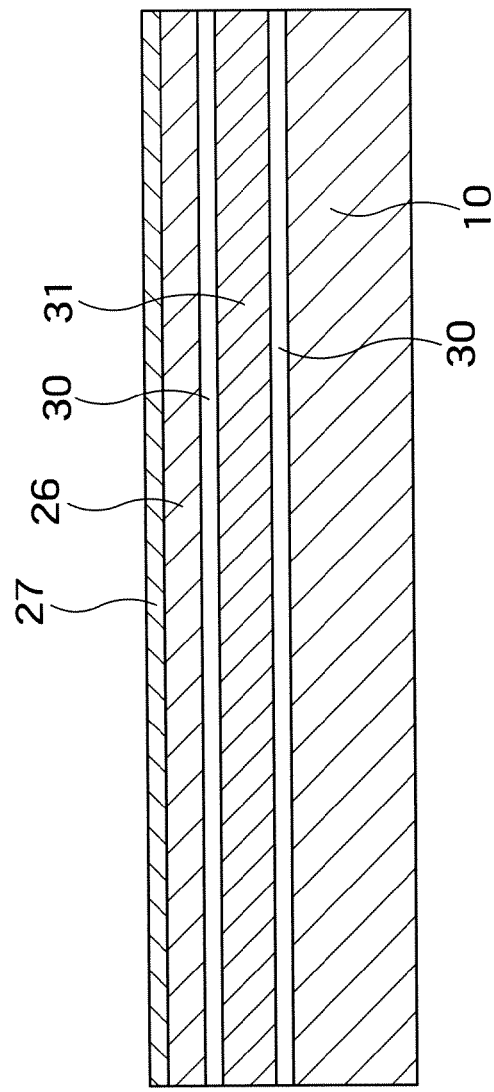
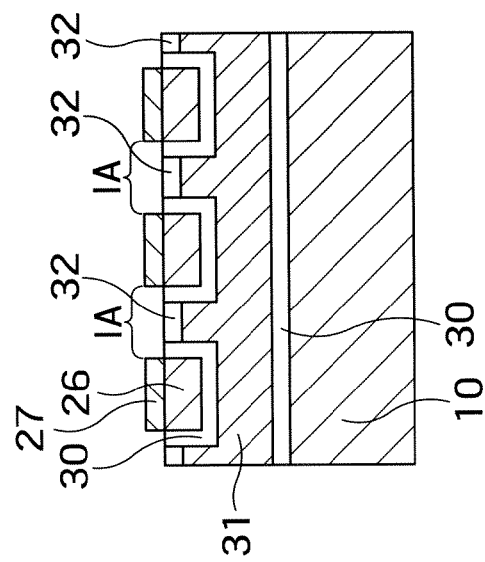
FIG. 10A
FIG. 10B

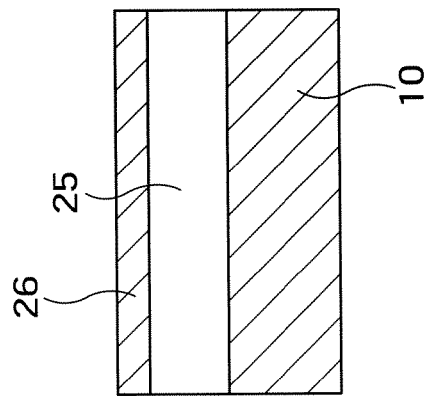
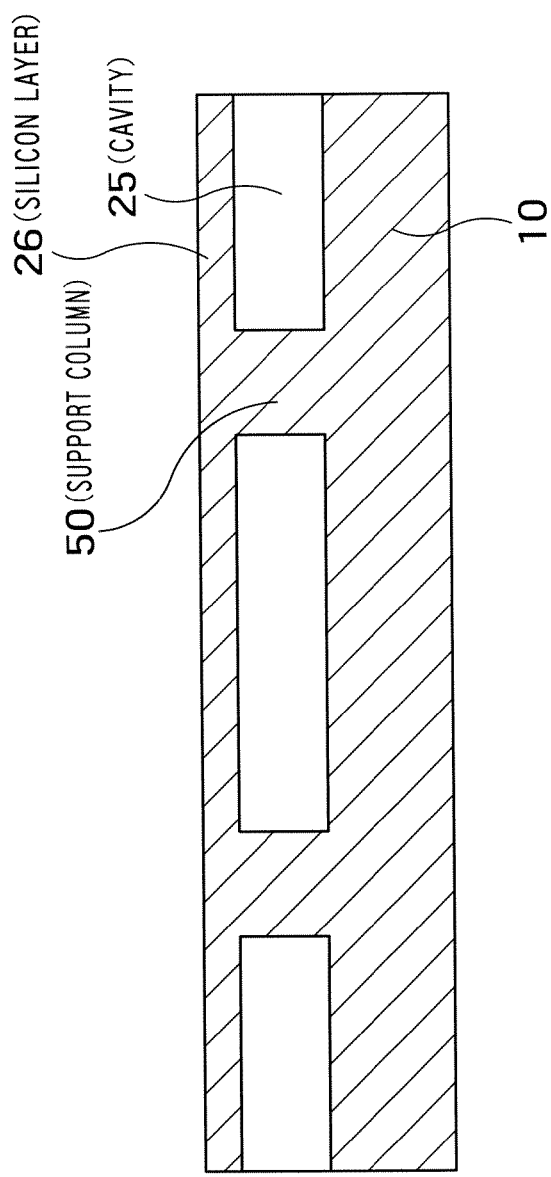

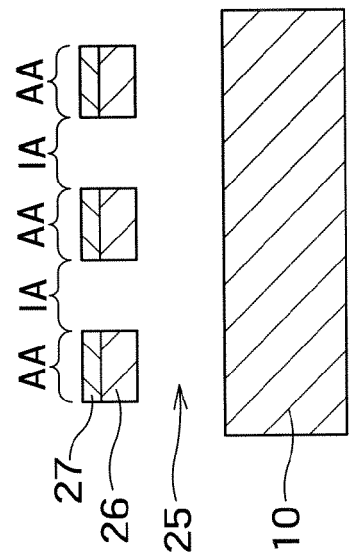
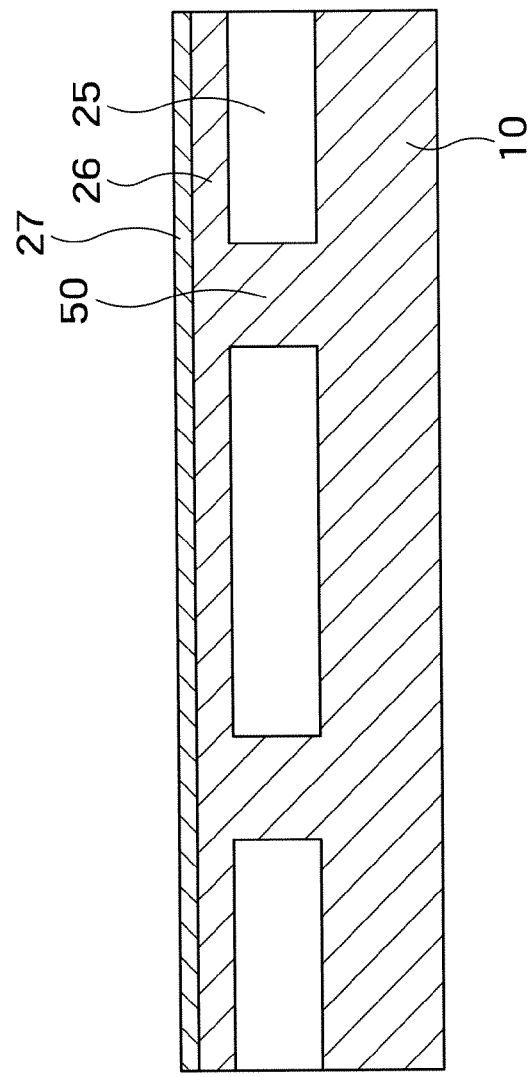
FIG. 20B
FIG. 20A

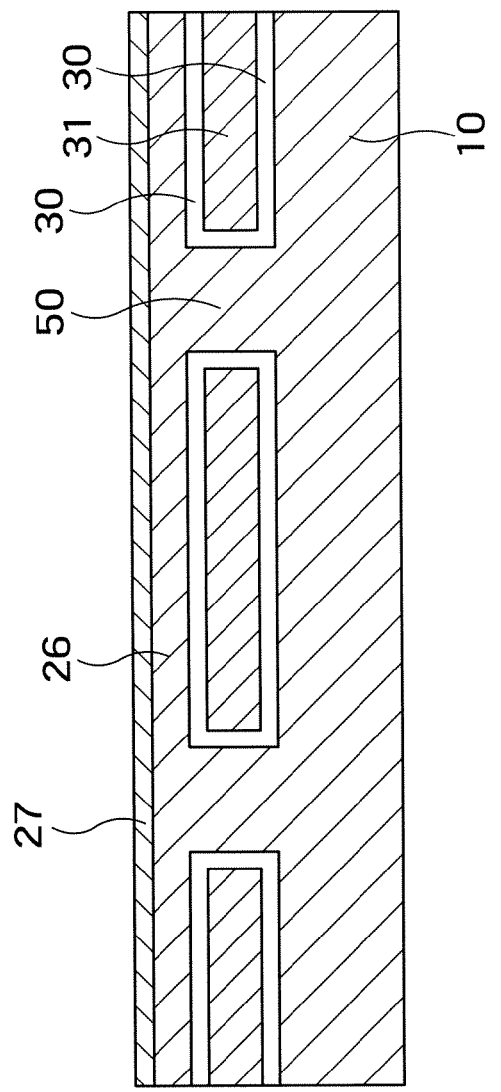
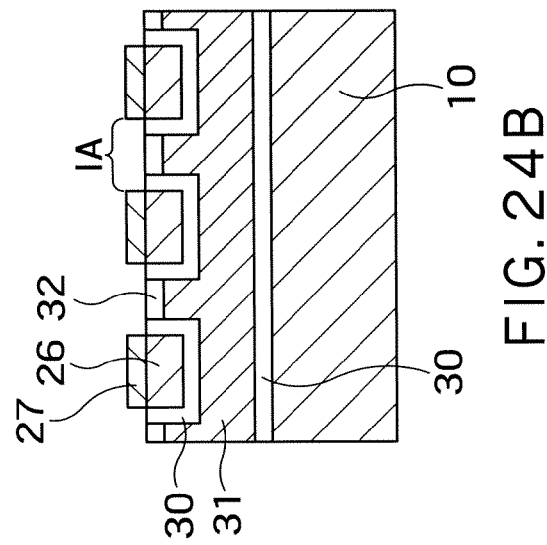
FIG. 24A
FIG. 24B

SEMICONDUCTOR MEMORY DEVICE HAVING A FLOATING BODY AND A PLATE ELECTRODE

CROSS-REFERENCE TO RELATED APPLICATION

This application is based upon and claims the benefit of priority from the prior Japanese Patent Applications No. 2006-190585, filed on Jul. 11, 2006, the entire contents of which are incorporated herein by reference.

BACKGROUND OF THE INVENTION

1. Field of the Invention

The present invention relates to a semiconductor memory device and a method of manufacturing a semiconductor memory device.

2. Related Art

Development of an FBC (Floating Body Cell) memory device that stores data in each FBC according to the number of a plurality of carries accumulated in a floating body of the FBC has been underway in place of a DRAM (Dynamic Random Access Memory) comprised of 1T (Transistor)-1C (Capacitor) type memory cells (Patent document 1). The FBC can dispense with the capacitor essential to an ordinary DRAM cell, so that the memory cell structure of the FBC memory device is simpler than that of the DRAM cell. The FBC is, therefore, advantageously easier to manufacture than the DRAM cell.

Generally, the FBC is constituted by a MISFET (Metal Insulator Semiconductor Field Effect Transistor) formed on an SOI (Silicon On Insulator) substrate. The SOI substrate is more expensive than an ordinary bulk-silicon substrate. Due to this, the manufacturing cost of the FBC is disadvantageously higher than the DRAM cell. Furthermore, design environment (e.g., SPICE MODEL) used for forming an LSI circuit on the bulk substrate cannot be applied to the SOI substrate as it is. Therefore, it is disadvantageously necessary to change the design environment to be suited for the SOI substrate in an LSI region other than a memory region. Moreover, high breakdown-voltage transistor characteristics and ESD (Electrostatic Discharge) characteristics of an input/output circuit or the like are often, disadvantageously deteriorated in the LSI region other than the memory region.

SUMMARY OF THE INVENTION

A method of manufacturing a semiconductor memory device according to an embodiment of the present invention comprises forming a plurality of trenches in a semiconductor substrate; forming a semiconductor layer provided on a cavity by connecting lower spaces of the trenches to one another and closing upper openings of the trenches in a heat treatment under a hydrogen atmosphere; etching the semiconductor layer in an isolation formation area; forming an insulating film on a side surface and a bottom surface of the semiconductor layer; filling the cavity under the semiconductor layer with an electrode material; and forming a memory element on the semiconductor layer.

A semiconductor memory device according to an embodiment of the present invention comprises a semiconductor substrate; a source and a drain formed in a surface region of the semiconductor substrate; a support column provided below the source and intervening between the source and the semiconductor substrate; a floating body provided between the source and the drain and accumulating or releasing charges to store data; a gate insulating film provided on the floating body; a gate electrode provided on the gate insulating film; and a plate electrode provided below the drain and the floating body, and electrically isolated from the floating body and the semiconductor substrate, wherein the drain and the floating body are electrically isolated from the semiconductor substrate by the plate electrode.

BRIEF DESCRIPTION OF THE DRAWINGS

FIGS. 1 to 14B are cross-sections or plan views showing a method of manufacturing an FBC memory according to a first embodiment of the present invention; and FIGS. 15 to 28 are cross-sections or plan views showing a method of manufacturing an FBC memory device according to the second embodiment.

DETAILED DESCRIPTION OF THE INVENTION

Embodiments of the present invention will be explained below with reference to the accompanying drawings. The present invention is not limited to the embodiments.

First Embodiment

FIGS. 1 to 14B are cross-sections or plan views showing a method of manufacturing an FBC memory according to a first embodiment of the present invention. A structure shown in FIGS. 1 to 14B is the memory cell structure of the FBC memory in a memory region. A logic region ("LSI region") other than the memory region is formed on an ordinary bulk-silicon substrate and not formed on an SON (Silicon On Nothing) structure or an SOI structure (to be described later). Due to this, the logic region is not shown in FIGS. 1 to 14A, except for FIGS. 4C and 14B. FIGS. 1, 3, 5, 7, 9, 11, and 13 are plan views showing steps of the method of manufacturing the FBC memory device according to the first embodiment. FIGS. 2A, 4A, 6A, 8A, 10A, 12A, and 14A are cross-sections taken along lines A-A of FIGS. 1, 3, 5, 7, 9, 11, and 13, respectively. FIGS. 2B, 4B, 6B, 8B, 10B, and 12B are cross-sections taken along lines B-B of FIGS. 1, 3, 5, 7, 9, and 11, respectively.

Figure 1:
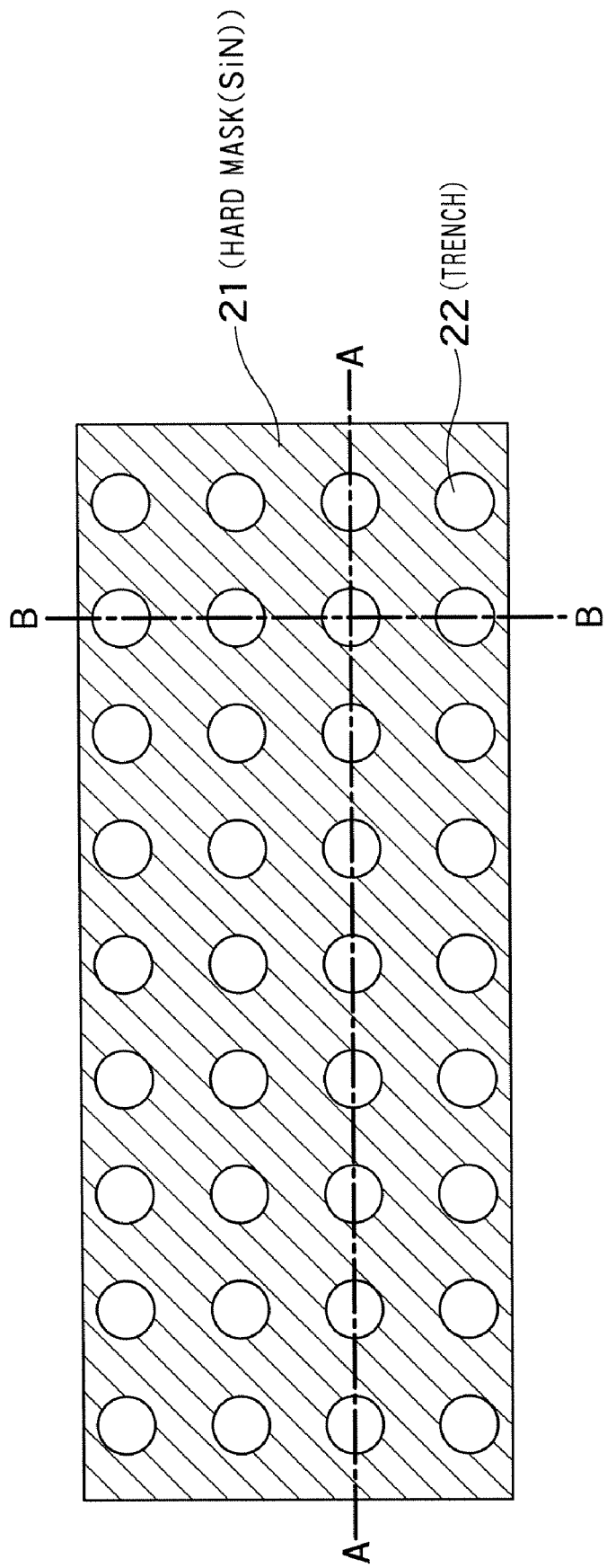
Figure 2:
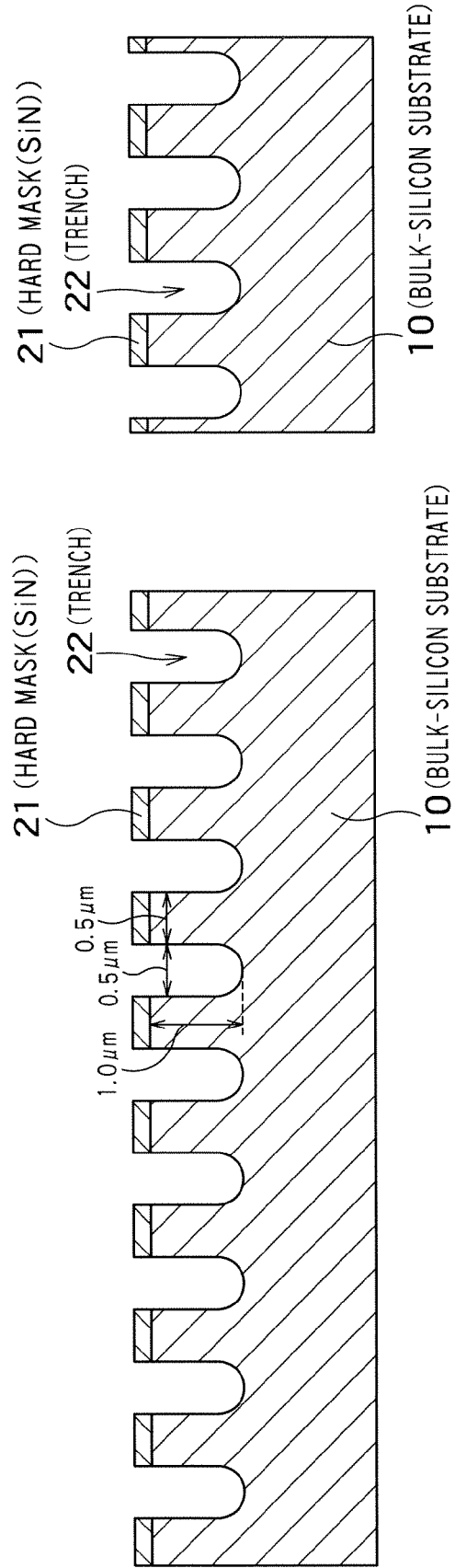

A silicon nitride film used as a hard mask 21 is first deposited on a bulk-silicon substrate 10 serving as a semiconductor substrate. A plurality of openings are formed in the hard mask 21 using lithography and RIE (Reactive Ion Etching). Using the hard mask 21 as a mask, the bulk-silicon substrate 10 is etched by the RIE. As a result, a plurality of trenches 22 is formed in the bulk-silicon substrate 10 as shown in FIGS. 1, 2A, and 2B. In the first embodiment, the trenches 22 are formed equidistantly in a matrix. Each of the trenches 22 has an opening diameter of, for example, 0.5 μm and a depth of, for example, 1.0 μm. The distance between the two adjacent trenches 22 is, for example, 0.5 μm. That is, the opening diameters of the trenches 22 are respectively almost equal to distances between two adjacent trenches of the trenches 22. The depths of the trenches 22 are twice as large as the opening diameters of the trenches 22.

Figure 3:
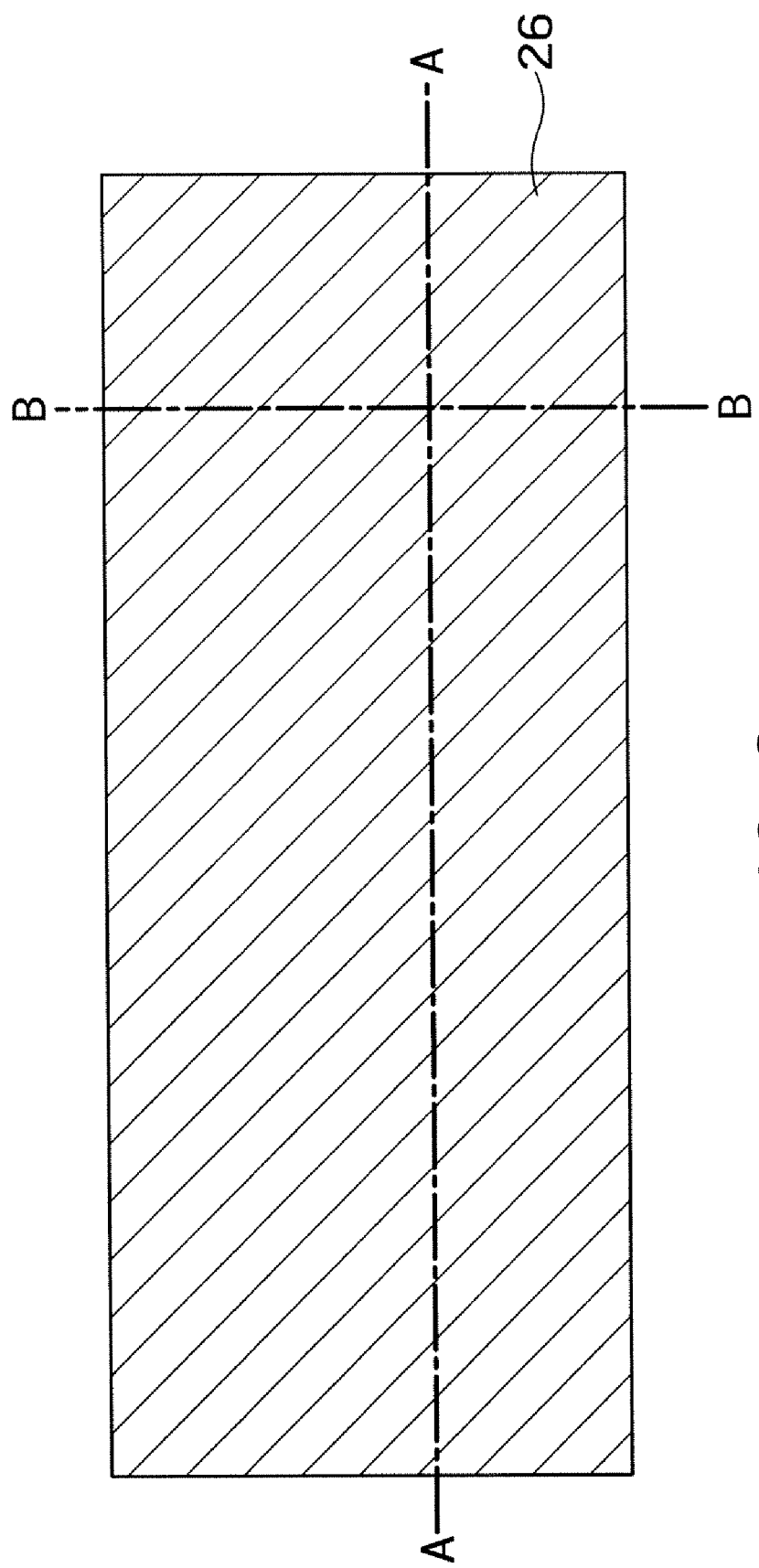

After removing the hard mask 21, the bulk-silicon substrate 10 is subjected to a heat treatment in hydrogen atmosphere. The heat treatment is performed, for example, at an atmospheric pressure of 300 Torr for about three minutes under the hydrogen atmosphere at 1000° C. As a result, upper openings of the respective trenches 22 are closed as shown in FIG. 3. Furthermore, as shown in FIGS. 4A and 4B, lower spaces of the trenches 22 are connected to one another. Accordingly, a cavity 25 is provided on the bulk-silicon substrate 10, and a silicon layer 26 serving as a semiconductor layer is formed on the cavity 25. The structure shown in FIGS. 4A and 4B is so-called silicon on nothing (SON) structure. Namely, by performing the heat treatment under the hydrogen atmosphere, the SON structure can be formed in the memory region while maintaining the state of the bulk-silicon substrate 10 in the logic region (See FIG. 4C).

Specifically, the heat treatment under the hydrogen atmosphere causes silicon on the surface of each trench 22 to flow to thereby minimize surface energy, and deforms the inner space of the trench 22 into a spherical shape. As a result, the upper openings of the trenches 22 are gradually closed, thereby eventually forming the silicon layer 26. Moreover, the inner spaces of the adjacent trenches 22 are connected to one another, whereby the cavity 25 is formed. The silicon layer 26 is supported by the boundary with the bulk-silicon substrate around the silicon layer.

As shown in FIGS. 5 and 6A, a silicon nitride film to be used as a hard mask 27 is deposited. The silicon nitride film is patterned into a line-space shape by the lithography and the RIE so as to cover up active areas AA. Using the hard mask 27 thus formed, the silicon layer 26 in element-isolation formation areas IA is etched into the line-space shape by the RIE. As a result, the cavity 25 is communicated with the outside in the element-isolation formation areas IA as shown in FIG. 6B.

Figure 8B:
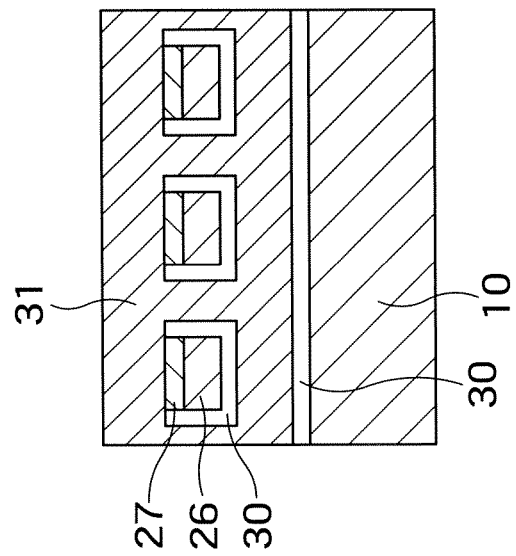
Figure 8A:
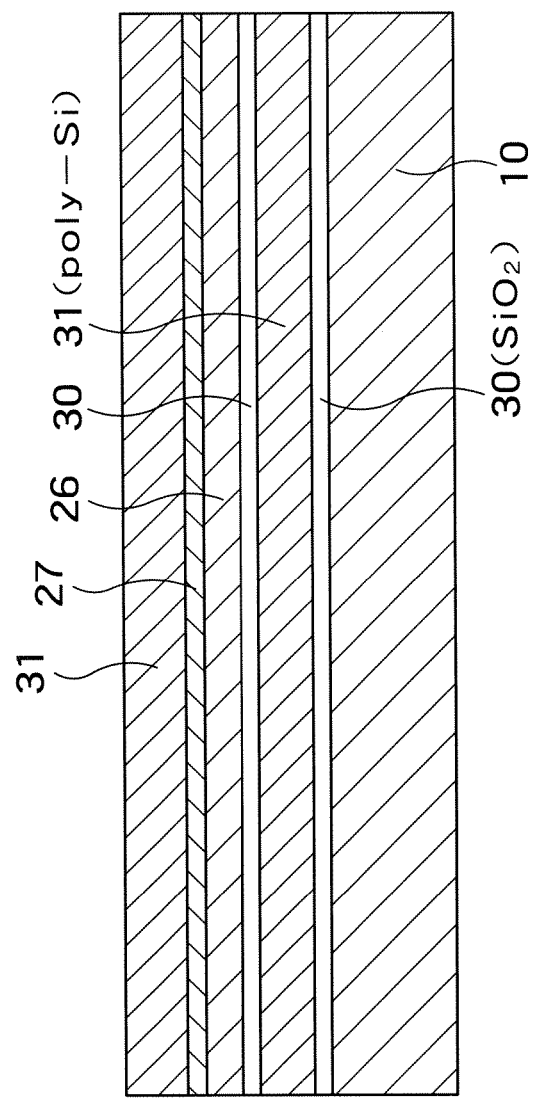

The bulk-silicon substrate 10 is then oxidized. During the oxidization, the cavity 25 is communicated with the outside through the element-isolation formation areas IA. Due to this, as shown in FIGS. 8A and 8B, the interior of the cavity 25 and the surface of the silicon layer 26 are oxidized. Accordingly, a silicon oxide film 30 is formed on the side surface of the silicon layer 26, the bottom of the silicon layer 26, and the bottom of the cavity 25. The thickness of the silicon oxide film 30 is, for example, 10 nm.

Figure 7:
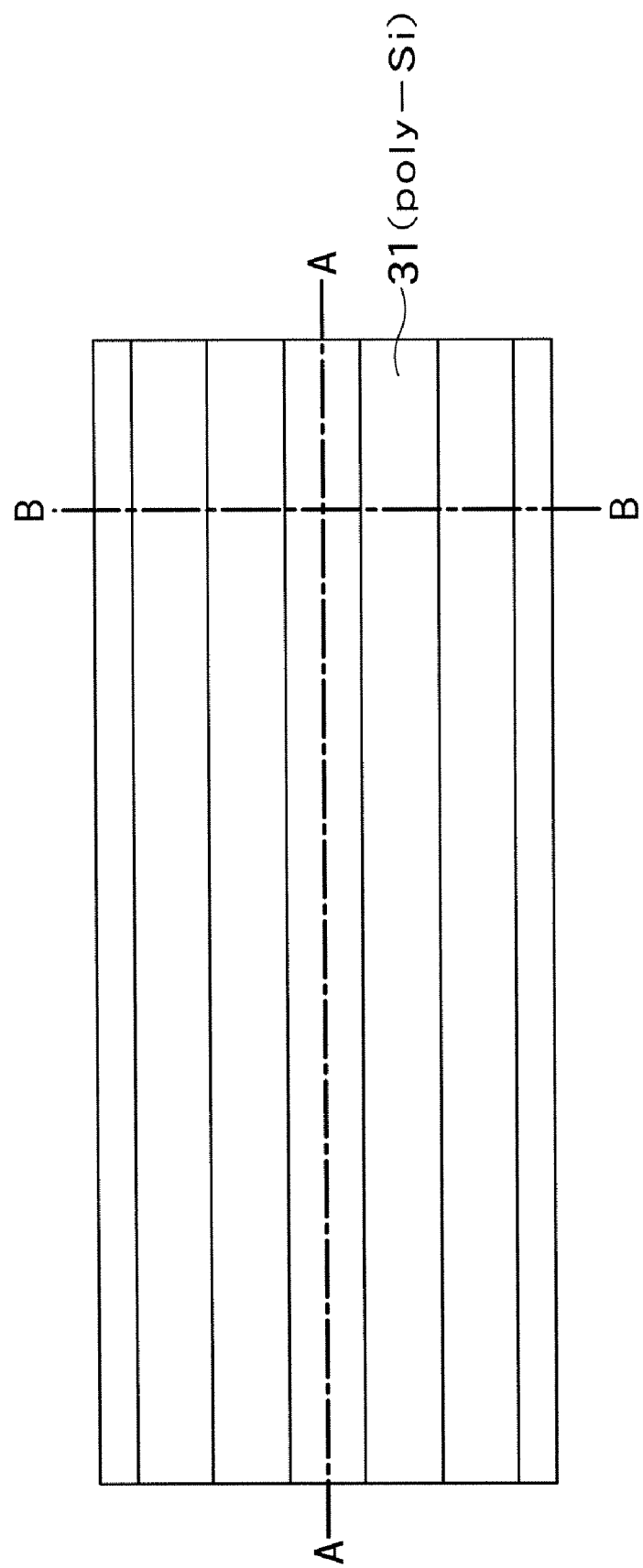

A polysilicon layer 31 is deposited as an electrode material using CVD (Chemical Vapor Deposition). As a result, the cavity 25 is filled with the polysilicon layer 31 as shown in FIGS. 7, 8A, and 8B. The polysilicon layer 31 filled up in the cavity 25 is used as a plate electrode.

Figure 9:
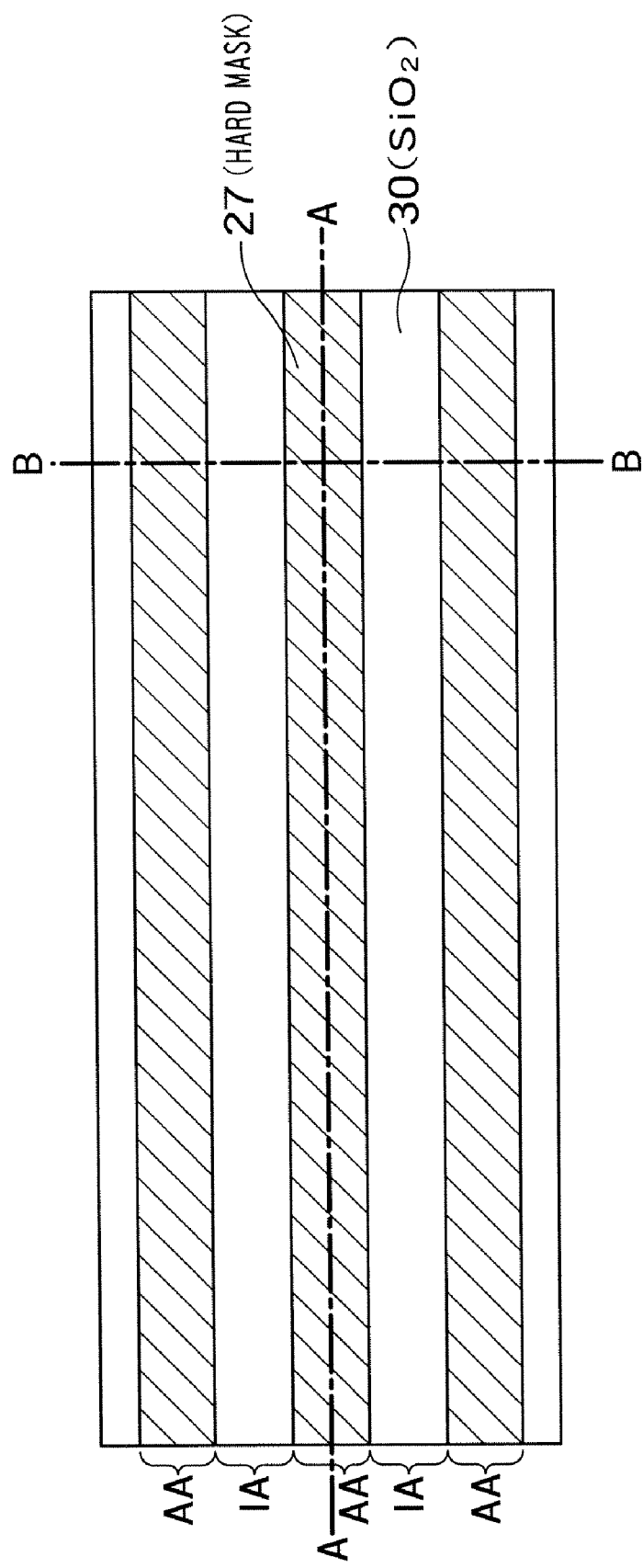

The polysilicon layer 31 is etched back, thereby removing the polysilicon layer 31 located at higher level than the surface level of the silicon layer 26 as shown in FIGS. 10A and 10B. At this moment, the polysilicon layer 31 filled up in the cavity 25 and in the element-isolation formation areas IA is left unremoved. The exposed surface of the polysilicon layer 31 in the element-isolation formation areas IA is oxidized. As a result, a silicon oxide film 32 serving as an element-isolation layer is formed in the element-isolation formation areas IA as shown in FIGS. 9 and 10B.

Figure 11:
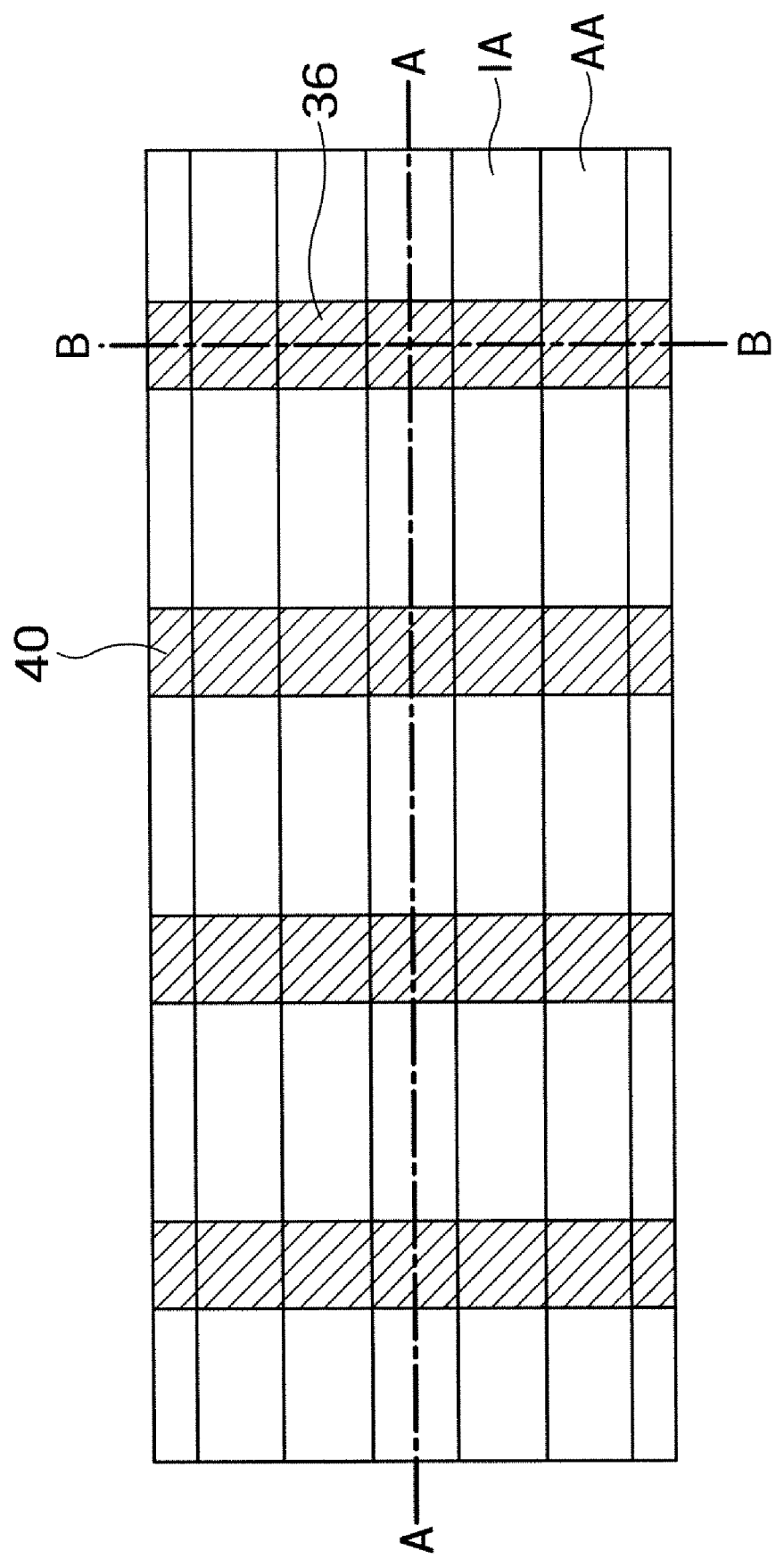
Figures 12A, 12B:
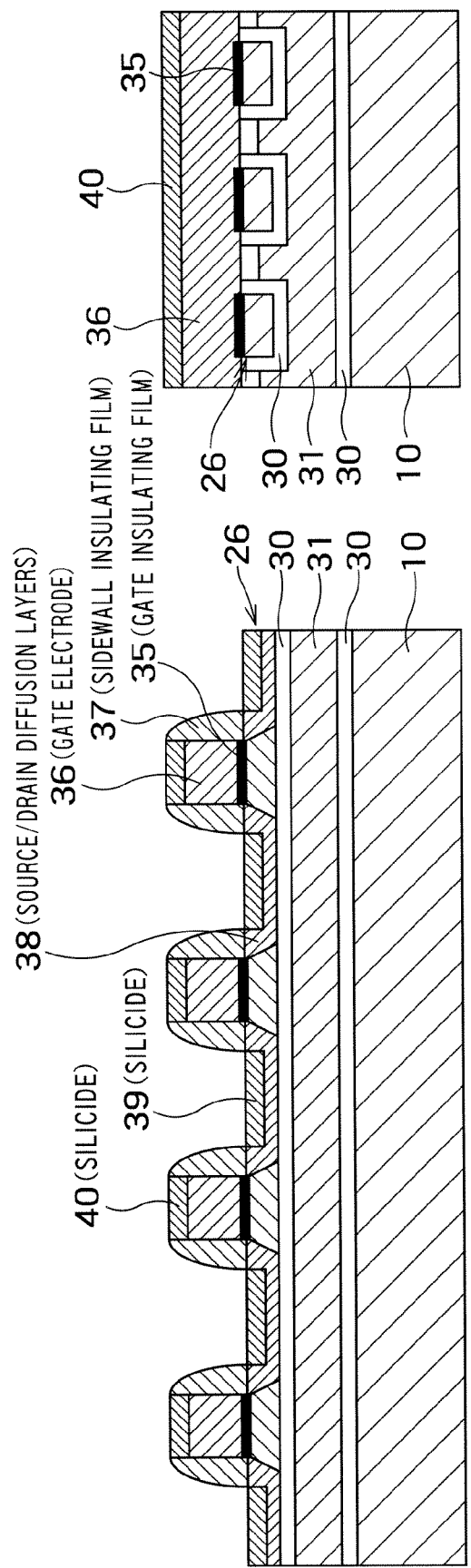

A gate insulating film 35 is then formed on the silicon layer 26. Polysilicon is deposited subsequently to formation of the gate insulating film 35, and the polysilicon is patterned by the lithography and the RIE, thereby forming a gate electrode 36 as shown in FIGS. 11, 12A, and 12B.

Using the gate electrode 36 as a mask, impurity ions are implanted, thereby forming an LDD (Lightly Diffused Drain) in he silicon layer 26. A sidewall insulating film 37 is formed on the side surface of the gate electrode 36. Using the sidewall insulating film 37 as a mask, impurity ions are further implanted, thereby forming source/drain diffusion layers 38 in the silicon layer 26.

Metal (e.g., nickel) is deposited on the source/drain diffusion layers 38 and the gate electrode 36 so as to react silicon with the metal. By doing so, a silicide layer 39 is formed on the source/drain diffusion layers 38 and a silicide layer 40 is formed on the gate electrode 36.

Figure 13:
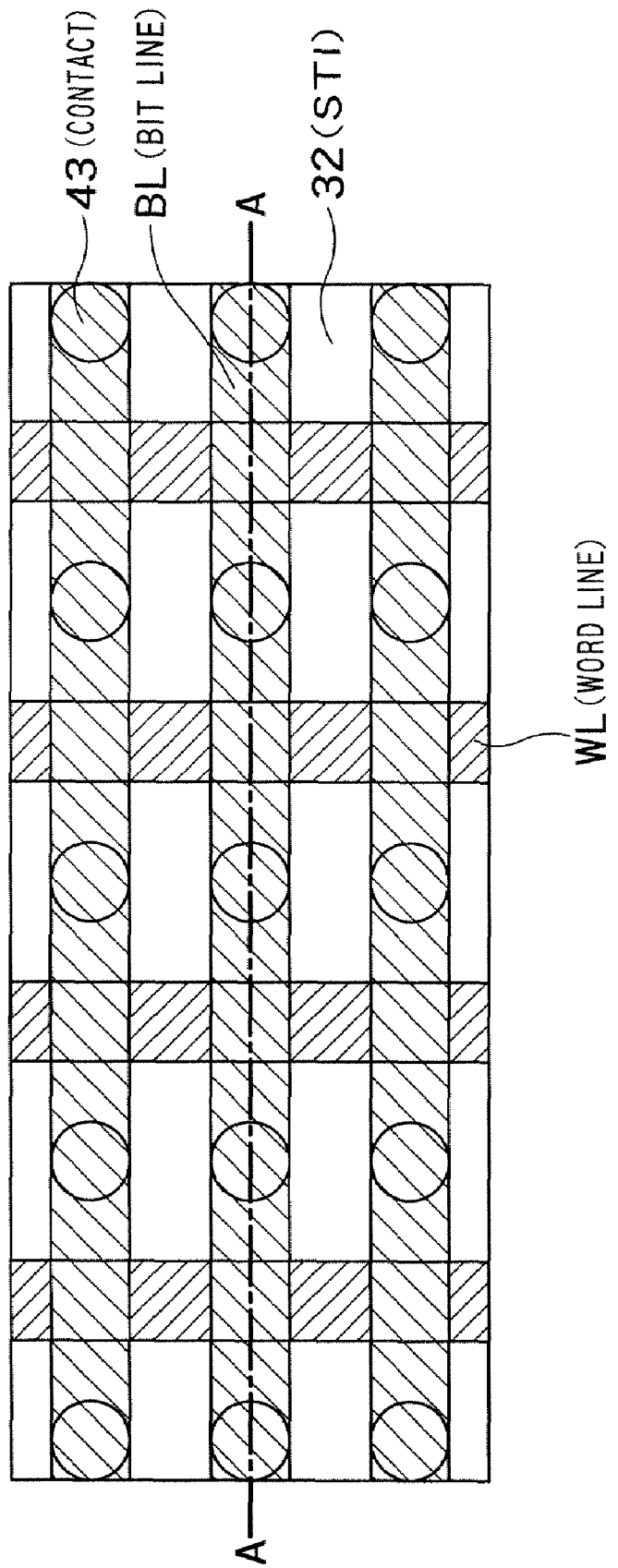
Figure 14:
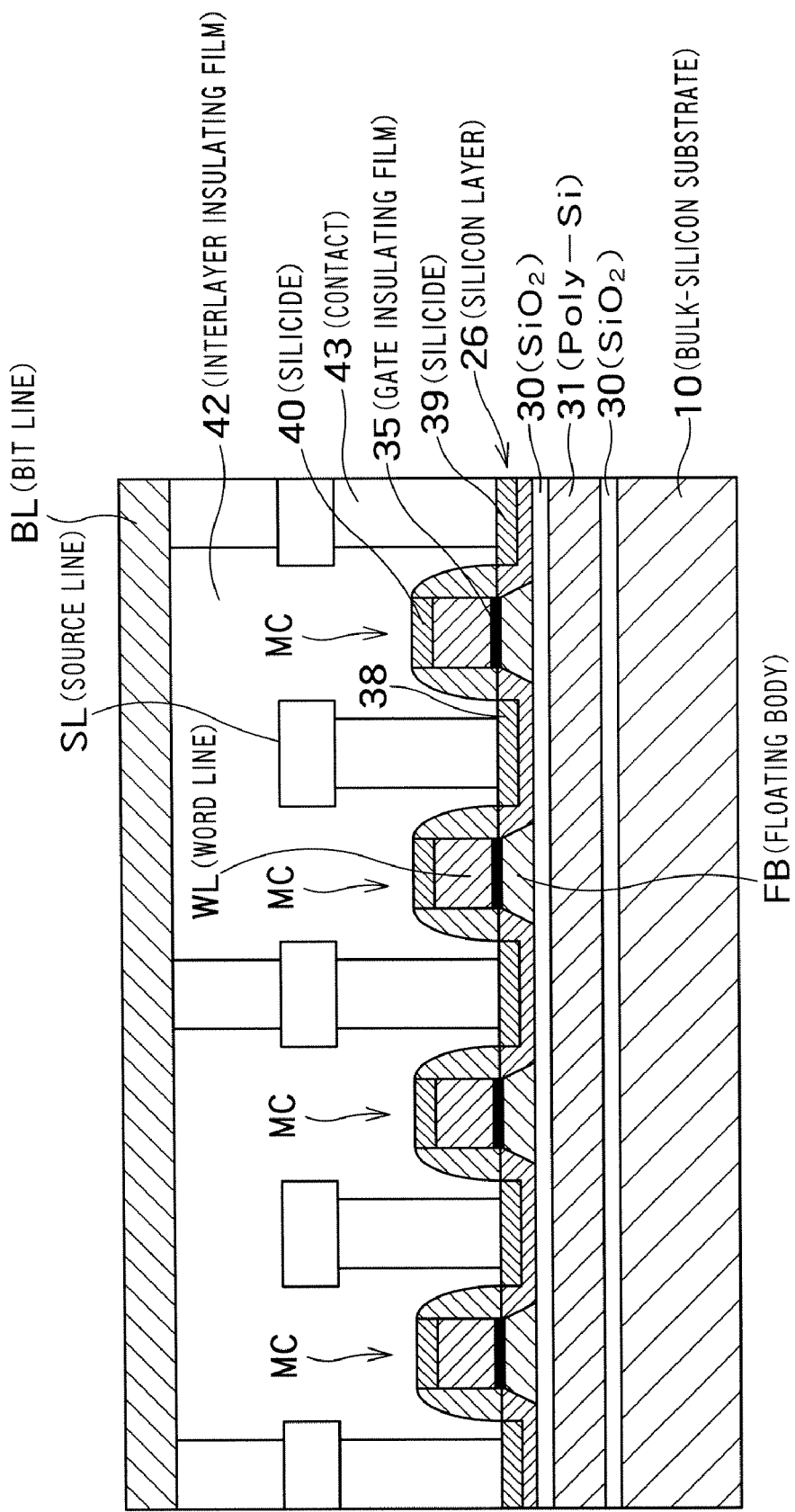
Figure 14B:
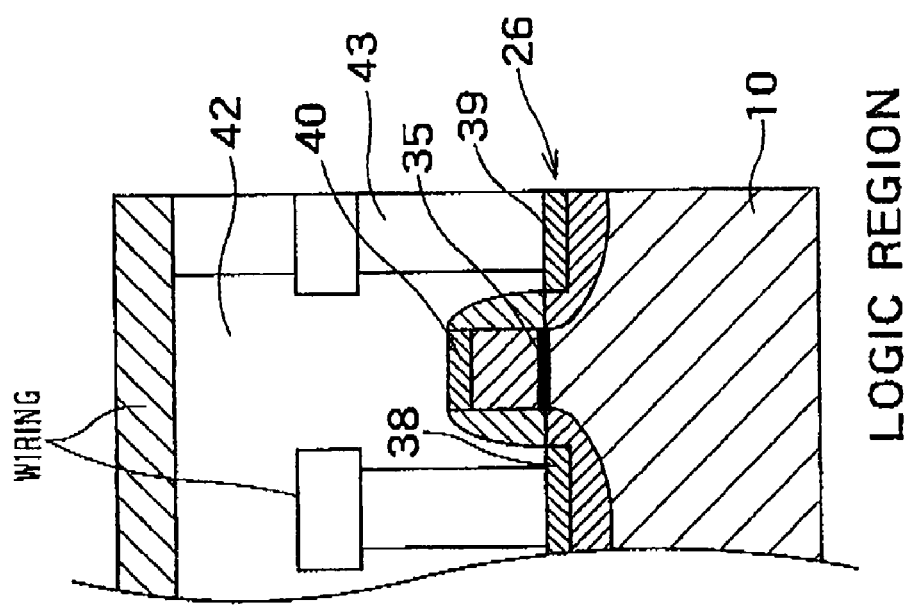

Thereafter, using a well-known method, an interlayer insulating film 42, contacts 43, source lines SL, and bit lines BL are formed as shown in FIGS. 13 and 14. Simultaneously with formation of the source lines SL and the bit lines BL, wirings are formed in the logic region, as shown in FIG. 14B. As a consequence, the FBC memory is formed. It is to be noted that the gate electrode 36 acts as a word line WL and that the polysilicon layer 31 acts as the plate electrode.

A floating body FB present under the word line WL (gate electrode 36) is surrounded by the source/drain diffusion layers 38, the gate insulating film 35, the silicon oxide film 30, and the element isolation layer 32. The floating body FB is, therefore, in an electrically floating state.

Impact ionization occurs to the boundary between the drain diffusion layer and the floating body FB when potential is applied to the word line WL and the bit line BL. Charges generated by the impact ionization are accumulated in the floating body FB. If the FBC is, for example, an n-type FET, holes are accumulated in the floating body FB. Electrons generated by the impact ionization are discharged to the drain diffusion layer 38.

The FBC stores therein data "0" or "1" according to the number of majority carriers accumulated in the floating body FB.

By applying the potential to the polysilicon layer 31 serving as the plate electrode while the FBC is in a data holding state, data-holding characteristics of the FBC can be improved.

In the manufacturing method according to the first embodiment, the FBC memory having the SOI structure can be formed using the bulk-silicon substrate 10. Therefore, the FBC memory can be manufactured at low cost with the manufacturing method according to the first embodiment.

In the manufacturing method according to the first embodiment, the FBC memory can be formed on the SOI substrate whereas the LSI circuit in the logic region can be directly formed on the ordinary bulk-silicon substrate 10. Therefore, it is possible to improve only the characteristics of the FBC memory without influencing the surrounding logic region. As a consequence, the existing design environment can be applied to the logic region. This can enhance design-development efficiency for the semiconductor memory device.

In the first embodiment, the LSI circuit in the logic region is directly formed on the bulk-silicon substrate 10. The LSI circuit formed on the bulk-silicon substrate 10 is superior to that formed on the SOI substrate in breakdown characteristics and ESD characteristics. The semiconductor memory device according to the first embodiment can be applied as a device which requires high breakdown voltage such as an input/output circuit.

In the memory region, the thickness of the silicon oxide film 30 between the polysilicon layer 31 serving as the plate electrode and the floating body FB is 10 nm. If the silicon oxide film 30 is thinner, a signal difference (potential difference between the data "0" and the data "1") is larger in data read operation. Furthermore, if the silicon oxide film 30 is thinner, then the charge-retention characteristics in the floating body FB are improved and more stable operation of the FBC memory can be ensured. If a charge-retention time is longer, the frequency of refresh operations can be made lower, thereby realizing high-rate operation and low power consumption. In view of the characteristics of the FBC memory, therefore, it is preferable that the silicon oxide film 30 is thinner. If a BOX (Buried Oxide) layer in the logic region is made thinner while the SOI substrate, for example, is used, parasitic capacity between the substrate and a channel region becomes higher. This may possibly deteriorate the performance of the FBC. In the first embodiment, however, the plate electrode is formed only in the memory region, and the surrounding logic circuit is formed on the bulk-silicon substrate 10. It is, therefore, possible to stabilize the operation of the FBC memory without influencing the surrounding logic circuit according to the first embodiment.

Second Embodiment

In the first embodiment, the entire memory region has the SOI structure. Alternatively, even if the source region of the memory cell is provided on the bulk-silicon substrate, the characteristics of the FBC memory are not deteriorated. In a second embodiment of the present invention, therefore, a source diffusion layer is formed on a bulk-silicon substrate.

FIGS. 15 to 28 are cross-sections or plan views showing a method of manufacturing an FBC memory device according to the second embodiment. A structure shown in FIGS. 15 to 28 is the memory cell structure of the FBC memory in a memory region, and a logic region other than the memory region is not shown in FIGS. 15 to 28. The SOI structure is not provided in the logic region, and an LSI circuit in a logic region is formed on an ordinary bulk-silicon substrate. FIGS. 15, 17, 19, 21, 23, 25 and 27 are plan views showing steps of the method of manufacturing the FBC memory device according to the second embodiment. FIGS. 16A, 18A, 20A, 22A, 24A, 26A, and 28 are cross-sections taken along lines A-A of FIGS. 15, 17, 19, 21, 23, 25, and 27, respectively. FIGS. 16B, 18B, 20B, 22B, 24B, and 26B are cross-sections taken along lines B-B of FIGS. 15, 17, 19, 21, 23, and 25, respectively.

Figure 15:
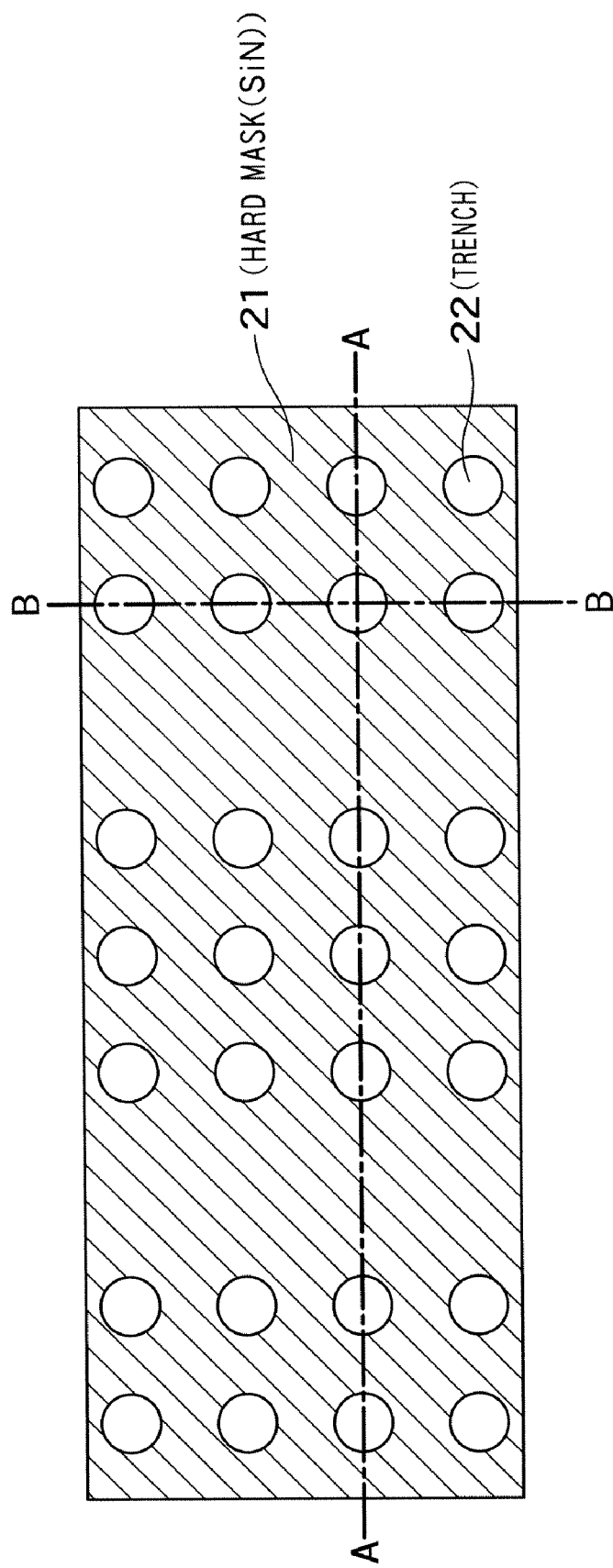
Figure 16B:
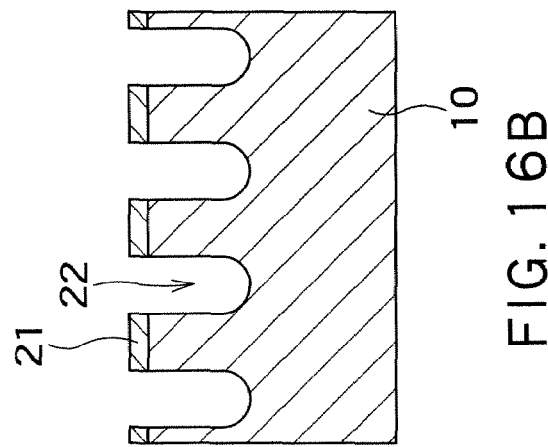
Figure 16A:
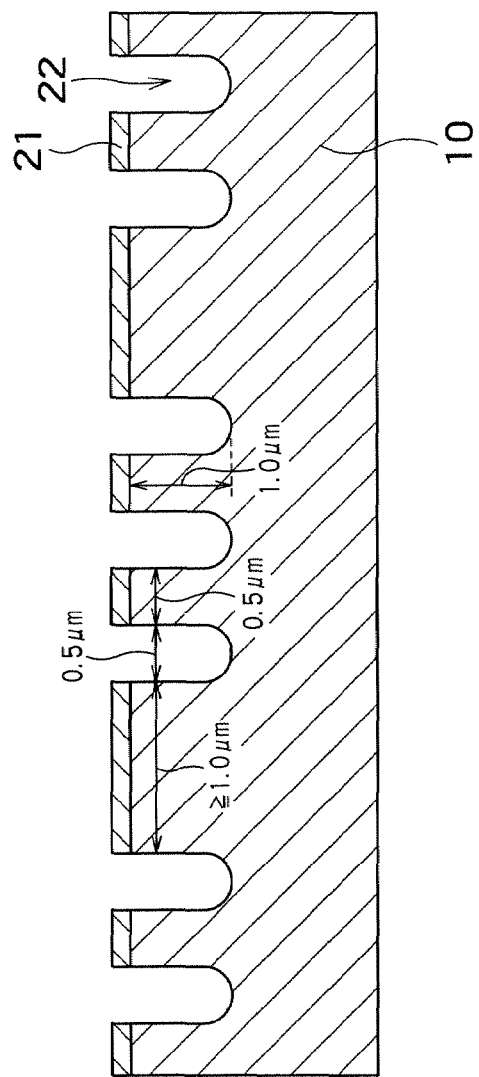

A silicon nitride film used as a hard mask 21 is first deposited on a bulk-silicon substrate 10 serving as a semiconductor substrate. A plurality of openings is formed in the hard mask 21 using the lithography and the RIE. At this moment, the openings are formed equidistantly in a matrix in the first embodiment. However, no openings are formed in a source formation region of the memory region in the second embodiment. Using the hard mask 21 as a mask, the bulk-silicon substrate 10 is etched by the RIE. As a result, a plurality of trenches 22 is formed in the bulk-silicon substrate 10 as shown in FIGS. 15, 16A, and 16B.

Each of the trenches 22 has an opening diameter of, for example, 0.5 μm and a depth of, for example, 1.0 μm. In regions other than the source formation region, the distance between the two adjacent trenches 22 is, for example, 0.5 μm. In the source formation region, the distance between the two adjacent trenches 22 is twice or more as large as the opening diameter. In the second embodiment, the distance between the two adjacent trenches 22 in the source formation region is, for example, equal to or larger than 1 μm.

Figure 17:
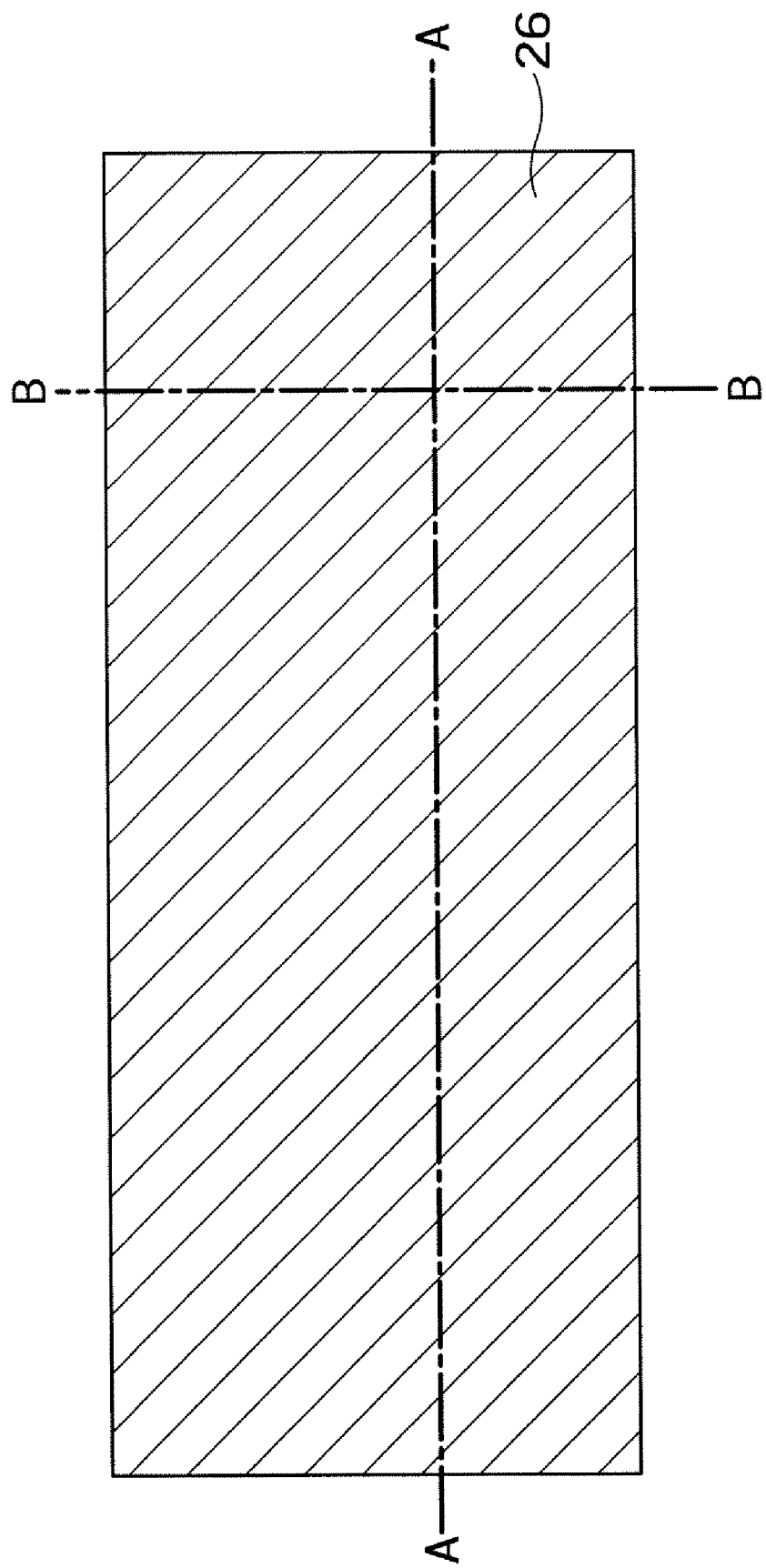

After removing the hard mask 21, the bulk-silicon substrate 10 is subjected to a heat treatment in hydrogen atmosphere. The heat treatment is performed, for example, at an atmospheric pressure of 300 Torr for about three minutes under the hydrogen atmosphere at 1100° C. As a result, upper openings of the respective trenches 22 are closed as shown in FIG. 17. Furthermore, as shown in FIGS. 18A and 18B, lower spaces of the trenches 22 are connected to one another. Accordingly, a cavity 25 is provided on the bulk-silicon substrate 10, and a silicon layer 26 serving as a semiconductor layer is formed on the cavity 25.

On the other hand, since no trenches are formed in the source formation region, the state of the bulk-silicon substrate 10 is maintained similarly to the logic region. A supporting column 50 made of silicon is formed in the source formation region. Parts of the memory region other than the source formation region are formed to have the SON structure. The silicon layer 26 is supported not only by the boundary between the memory region and the logic region but also by the supporting column 50. It is, therefore, possible to maintain the mechanical strength of the silicon layer 26, and prevent the silicon layer 26 from being caved in the cavity 25.

Figure 19:
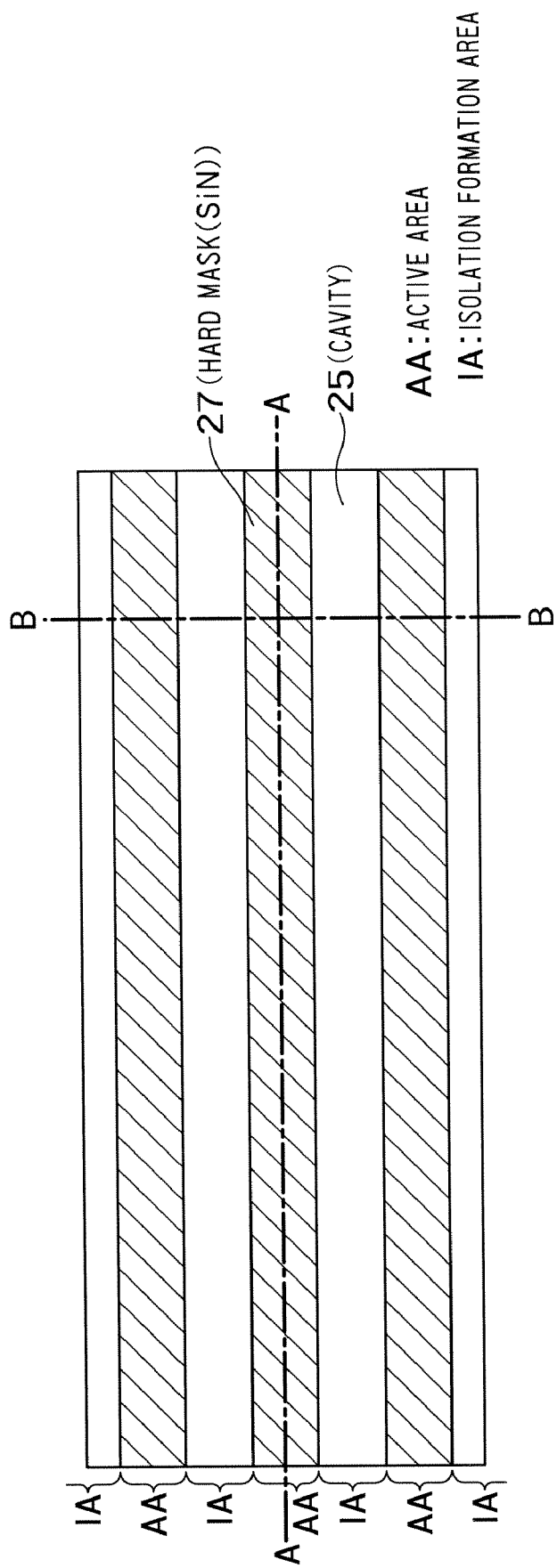

As shown in FIGS. 19 and 20A, a silicon nitride film to be used as a hard mask 27 is deposited. The silicon nitride film is patterned into a line-space shape by the lithography and the RIE so as to cover up active areas AA. Using the hard mask 27 thus formed, the silicon layer 26 in isolation formation areas IA is etched into the line-space shape by the RIE. As a result, the cavity 25 is communicated with the outside in the isolation formation areas IA as shown in FIG. 20B.

The bulk-silicon substrate 10 is then oxidized. During the oxidization, the cavity 25 is communicated with the outside through the isolation formation areas IA. Due to this, as shown in FIGS. 22A and 22B, the interior of the cavity 25 and the surface of the silicon layer 26 are oxidized. Accordingly, a silicon oxide film 30 is formed on the side surface of the silicon layer 26, the bottom of the silicon layer 26, and the bottom of the cavity 25. The thickness of the silicon oxide film 30 is, for example, 10 nm.

Figure 21:
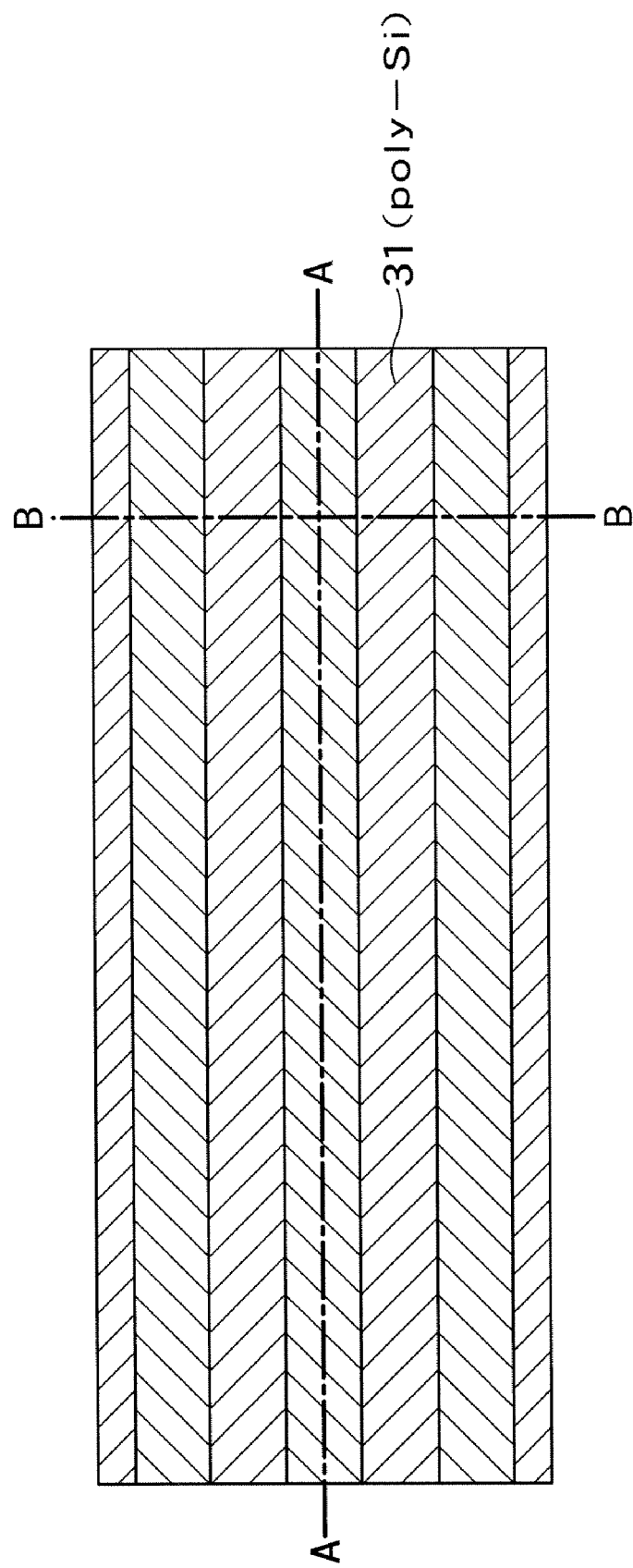
Figure 22:
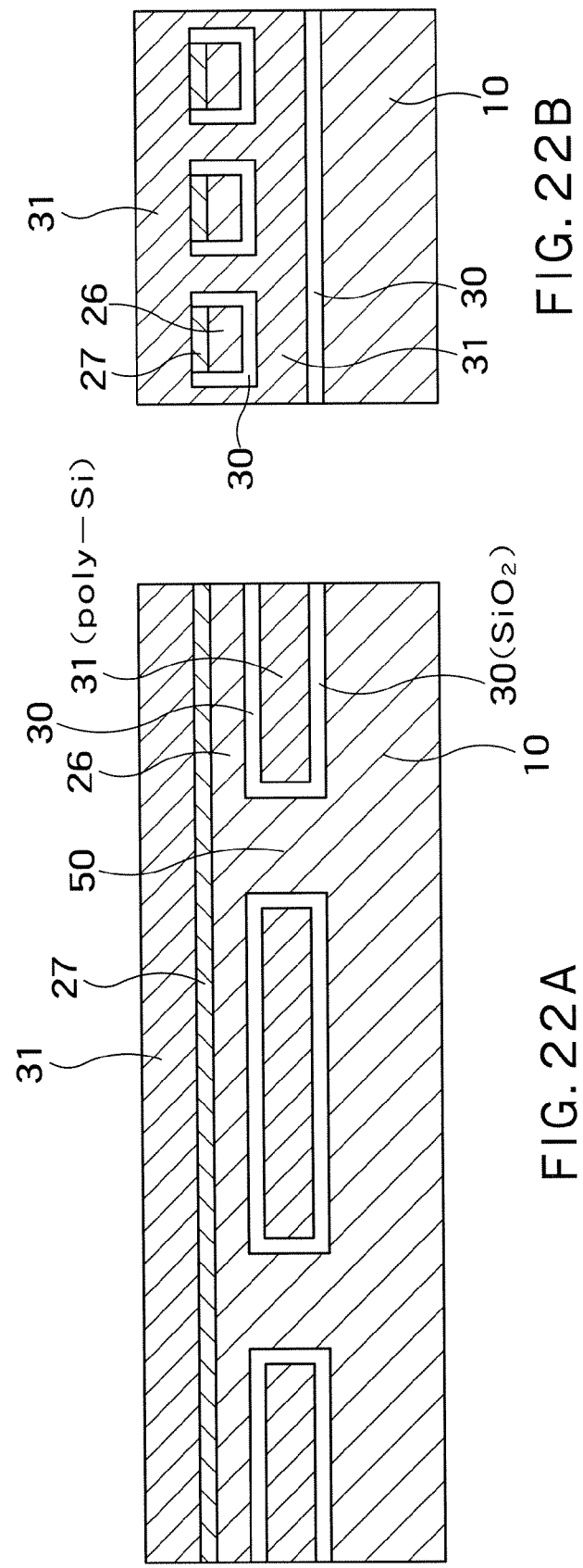

A polysilicon layer 31 is deposited as an electrode material using the CVD. As a result, the cavity 25 is filled with the polysilicon layer 31 as shown in FIGS. 21, 22A, and 22B. The polysilicon layer 31 filled up in the cavity 25 is used as a plate electrode.

Figure 23:
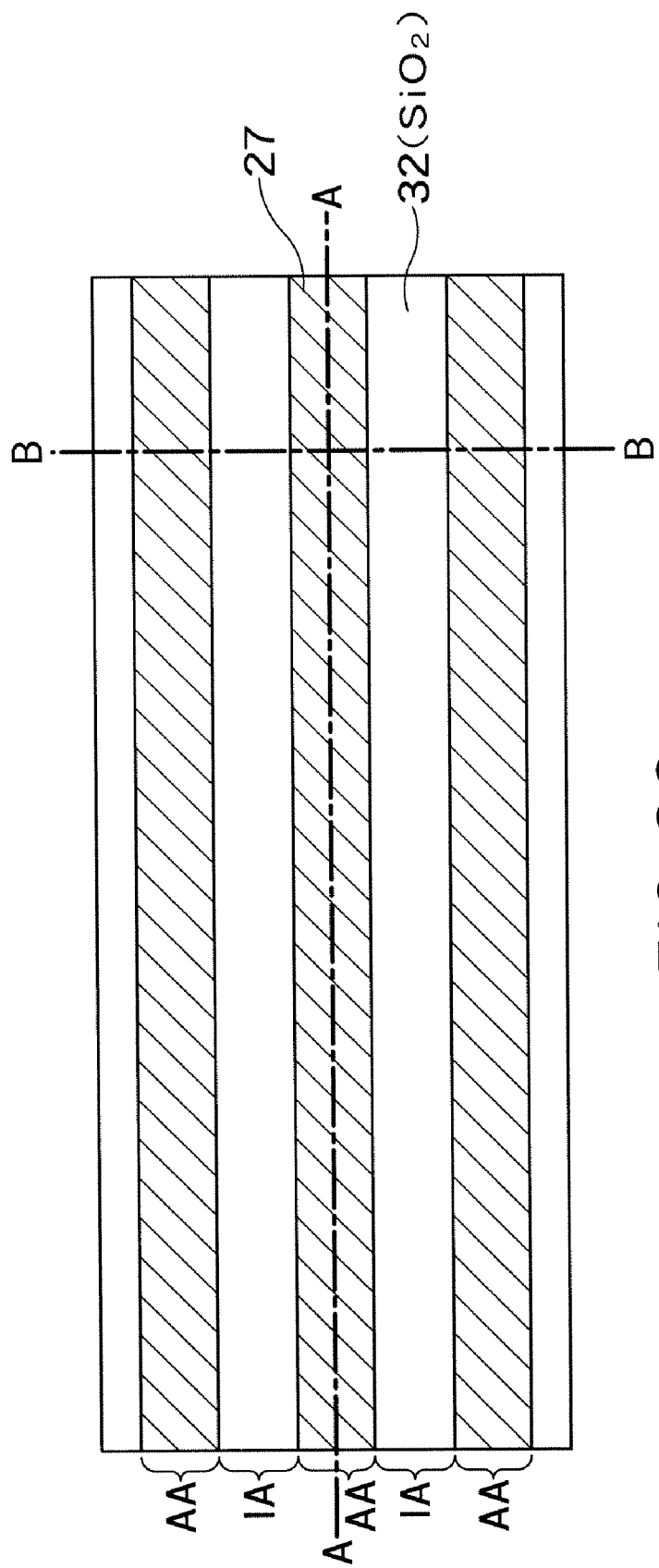

The polysilicon layer 31 is etched back, thereby removing the polysilicon layer 31 located at higher level than the surface level of the silicon layer 26 as shown in FIGS. 24A and 24B. At this moment, the polysilicon layer 31 filled up in the cavity 25 and in the isolation formation areas IA is left unremoved. The exposed surface of the polysilicon layer 31 in the isolation formation areas IA is oxidized. As a result, a silicon oxide film 32 serving as an element-isolation layer is formed in the isolation formation areas IA as shown in FIGS. 23 and 24B.

Figure 25:
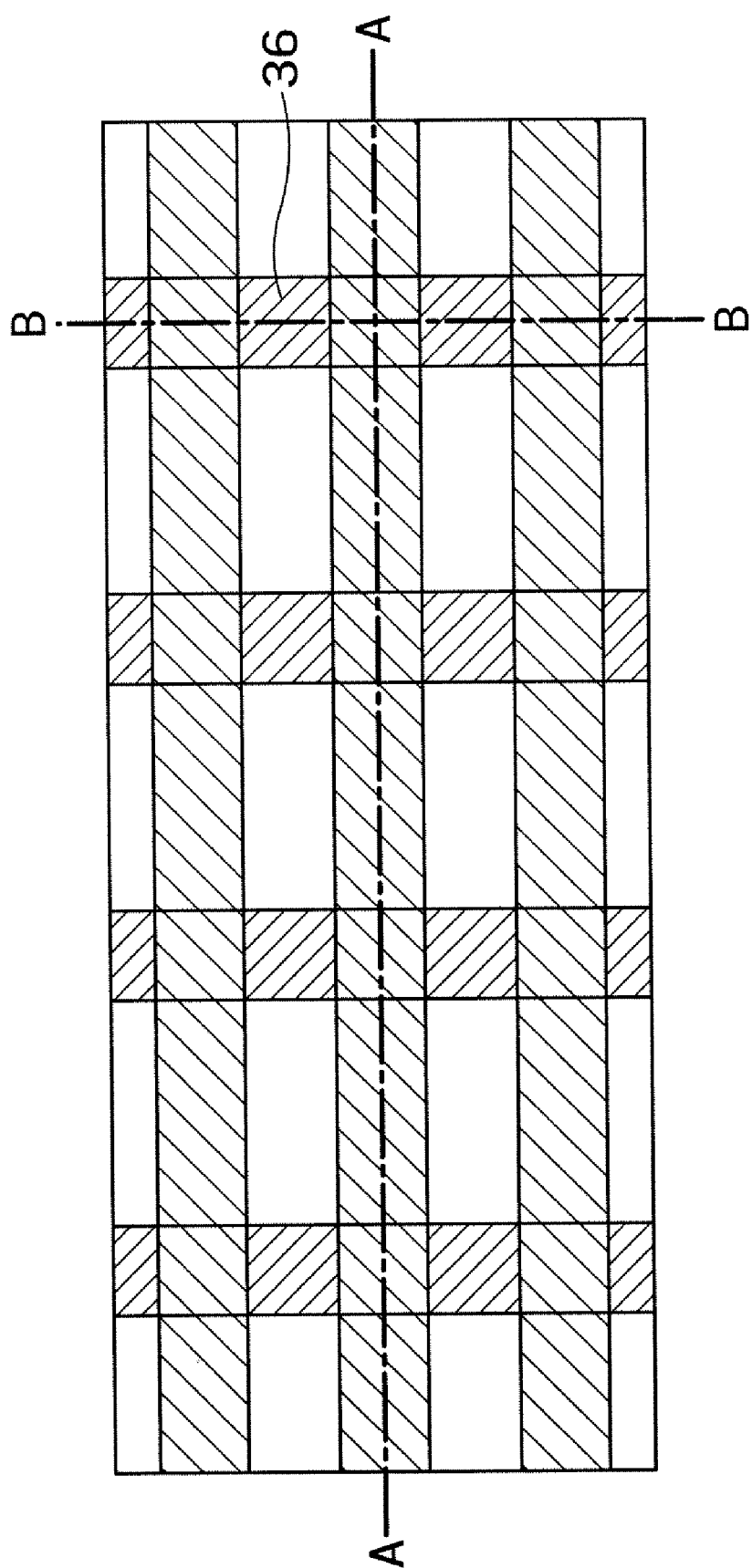
Figures 26A, 26B:
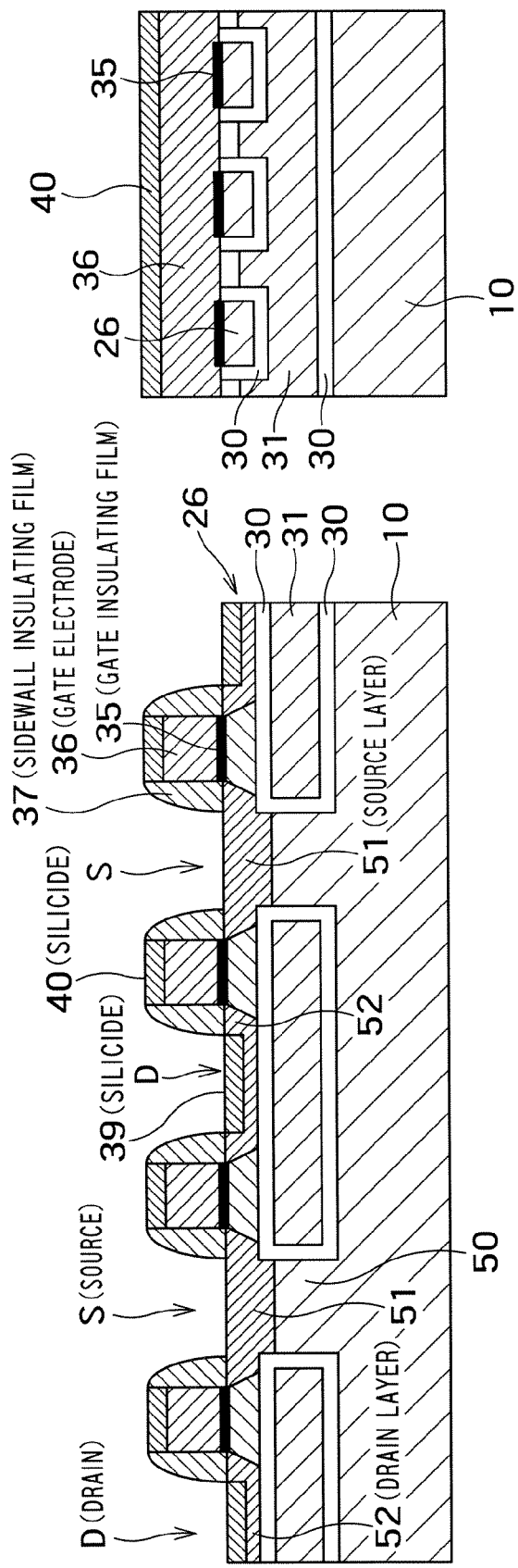

A gate insulating film 35 is then formed on the silicon layer 26. Polysilicon is deposited subsequently to formation of the gate insulating film 35, and the polysilicon is patterned by the lithography and the RIE, thereby forming a gate electrode 36 as shown in FIGS. 25, 26A, and 26B.

Using the gate electrode 36 as a mask, impurity ions are implanted, thereby forming an LDD in the silicon layer 26. A sidewall insulating film 37 is formed on the side surface of the gate electrode 36. Using the sidewall insulating film 37 as a mask, impurity ions are further implanted, thereby forming a source diffusion layer 51 and a drain diffusion layer 52 in the silicon layer 26.

Metal (e.g., nickel) is deposited on the source layer 51, the drain layer 52, and the gate electrode 36 so as to react silicon with the metal. By doing so, a silicide layer 39 is formed on the source diffusion layer 51 and the drain diffusion layers 52 and a silicide layer 40 is formed on the gate electrode 36.

Figure 27:
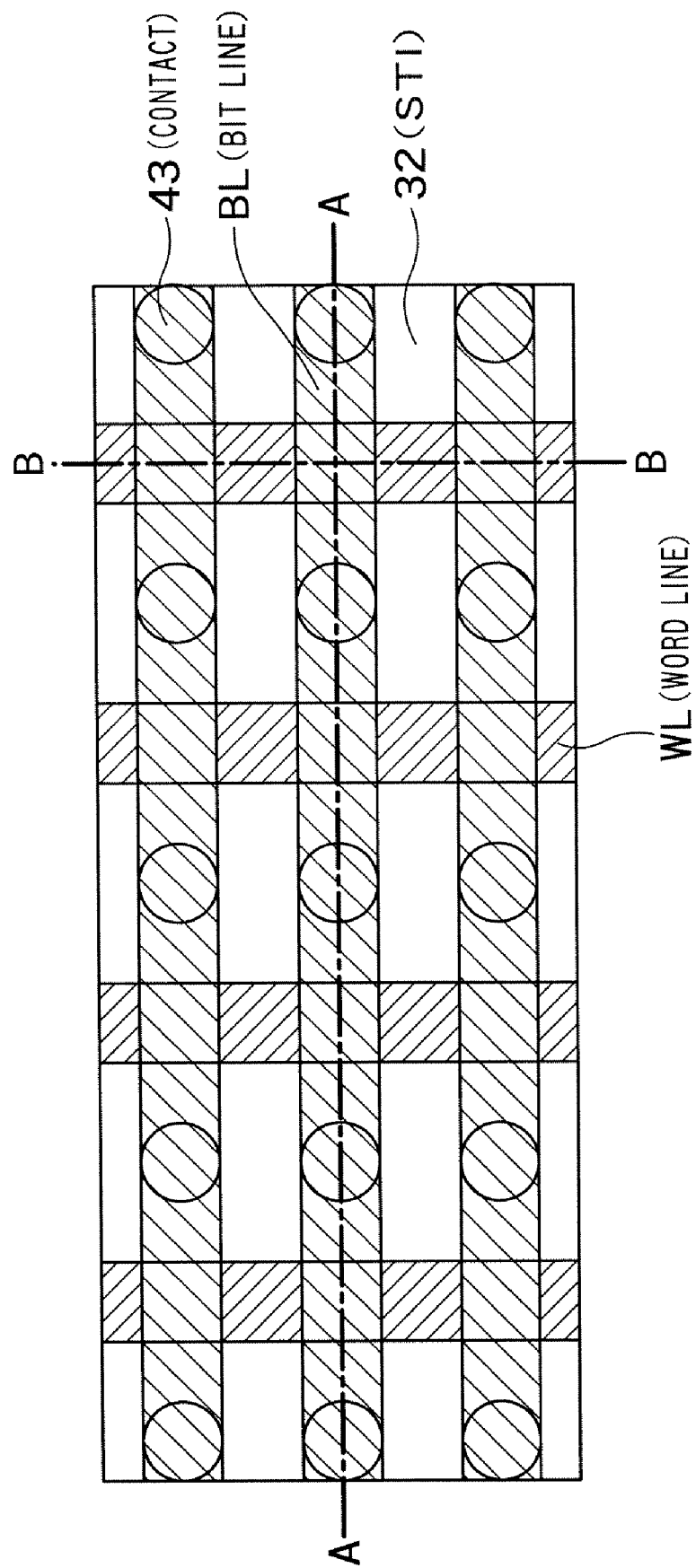
Figure 28:
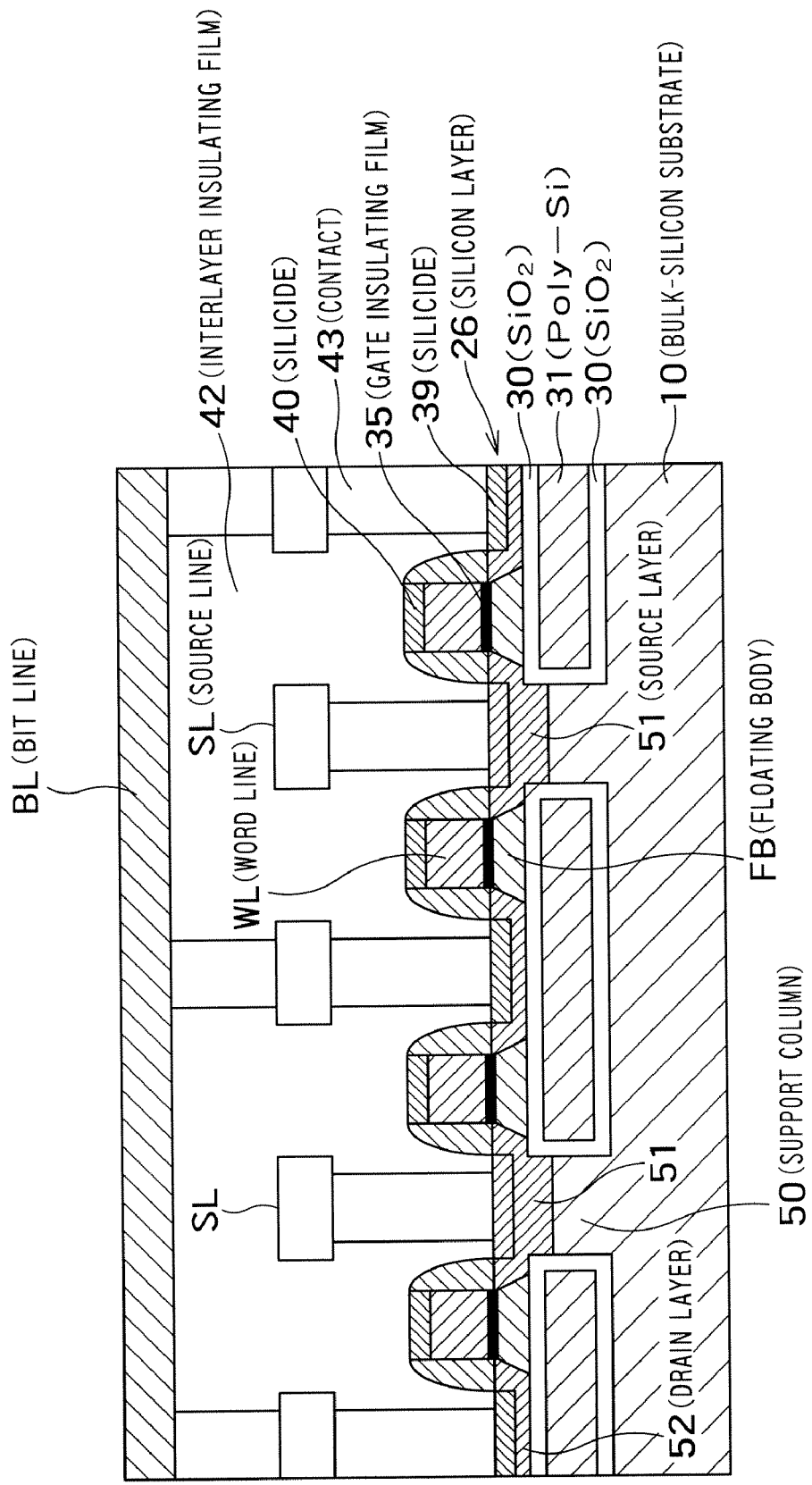

Thereafter, using a well-known method, an interlayer insulating film 42, contacts 43, source lines SL, and bit lines BL are formed as shown in FIGS. 27 and 28. Simultaneously with formation of the source lines SL and the bit lines BL, wirings are formed in the logic region. As a consequence, the FBC memory is formed. It is to be noted that the gate electrode 36 acts as a word line WL and that the polysilicon layer 31 acts as the plate electrode.

The source diffusion layer 51 is opposite in conduction type to the bulk-silicon substrate 10. Due to this, a pn junction is present between the source diffusion layer 51 and the bulk-silicon substrate 10. A bias in forward direction is not applied to the pn junction. Accordingly, even if the source of the memory element is connected to the bulk-silicon substrate 10, the characteristics of the memory cell are not deteriorated. In addition, no problems related to the operation of the memory cell occur.

The support column 50 made of silicon is formed in the source formation region in the second embodiment. Parts of the memory region other than the source formation region are formed to have the SOI structure. The silicon layer 26 is supported by not only the boundary between the memory region and the logic region but also by the support column 50. Due to this, the silicon layer 26 is stress-resistant at a subsequent oxidation step and not caved in the cavity 25. The second embodiment has the same effect as that of the first embodiment.

In the FBC memory according to the second embodiment, the plate electrode 31 is provided only below the drain layer 52 and the floating body FB and not provided below the source layer 51. The source layer 51 is electrically connected to the bulk-silicon substrate 10 through the support column 50. The support column 50 can be made of any one of a conductive material and an insulating material. The plate electrode 31 is electrically isolated from the drain layer 52, the floating body FB, and the bulk-silicon substrate 10. Furthermore, the drain layer 52 and the floating body FB are electrically isolated from the bulk-silicon substrate 10 by the plate electrode 31.

As described so far, even if the source of the memory element is connected to the bulk-silicon substrate 10, the characteristics of the memory element are not deteriorated. Moreover, the silicon layer 26 is supported not only by the boundary between the memory region and the logic region but also by the support 50. The silicon layer 26 is, therefore, resistant against mechanical stress. The FBC memory according to the second embodiment is advantageously easy to manufacture.

The invention claimed is:

1. A semiconductor memory device comprising:
   a semiconductor substrate;
   a source and a drain formed in a surface region of the semiconductor substrate;
   a support column provided below the source and intervening between the source and the semiconductor substrate;
   a floating body provided between the source and the drain and accumulating or releasing charges to store data;
   a gate insulating film provided on the floating body;
   a gate electrode provided on the gate insulating film;
   a plate electrode provided below the drain and the floating body, and electrically isolated from the floating body and the semiconductor substrate,
   a source line electrically connected to the source;
   a bit line electrically connected to the drain;
   a source line contact connecting between the source line and the source;
   a bit line contact connecting between the bit line and the drain, wherein
   the drain and the floating body are electrically isolated from the semiconductor substrate by the plate electrode; and
   the plate electrode is provided under a whole of the drain and a whole of the floating body, but not provided under the source.

2. The semiconductor memory device according to claim 1, wherein
   the support column includes an insulation material.

3. The semiconductor memory device according to claim 1, wherein
   the support column includes a conductive material.

4. The semiconductor memory device according to claim 1, wherein
   the support column electrically connects the source to the semiconductor substrate.

5. The semiconductor memory device according to claim 1 further comprising:
   a memory region in which memory cells respectively including the floating body are provided; and
   a logic region in which a logic circuit controlling the memory cell is provided, wherein
   a plurality of support columns are provided equidistantly in the memory region other than a boundary between the memory region and the logic region.

6. The semiconductor memory device according to claim 1, wherein the plate electrode is provided right under the bit line contact.

7. The semiconductor memory device according to claim 5, wherein the plate electrode is provided only in the memory region, but is not provided in the logic region and the logic region is directly formed on the semiconductor substrate.

* * * * *